US010955479B2

(12) United States Patent
Nakao et al.

(10) Patent No.: US 10,955,479 B2
(45) Date of Patent: Mar. 23, 2021

(54) BATTERY CONTROL DEVICE

(71) Applicant: Vehicle Energy Japan Inc., Hitachinaka (JP)

(72) Inventors: Ryohhei Nakao, Hitachinaka (JP); Keiichiro Ohkawa, Hitachinaka (JP)

(73) Assignee: Vehicle Energy Japan Inc., Hitachinaka (JP)

( * ) Notice: Subject to any disclaimer, the term of this patent is extended or adjusted under 35 U.S.C. 154(b) by 0 days.

(21) Appl. No.: 16/301,899

(22) PCT Filed: Apr. 7, 2017

(86) PCT No.: PCT/JP2017/014482
§ 371 (c)(1),
(2) Date: Nov. 15, 2018

(87) PCT Pub. No.: WO2017/199629
PCT Pub. Date: Nov. 23, 2017

(65) Prior Publication Data
US 2019/0288344 A1 Sep. 19, 2019

(30) Foreign Application Priority Data
May 18, 2016 (JP) .............................. JP2016-099655

(51) Int. Cl.
*H01M 4/02* (2006.01)
*G01R 31/36* (2020.01)
(Continued)

(52) U.S. Cl.
CPC ............ *G01R 31/36* (2013.01); *B60L 3/0046* (2013.01); *B60L 50/60* (2019.02); *B60L 58/12* (2019.02);
(Continued)

(58) Field of Classification Search
CPC ...................................................... H01M 4/02
See application file for complete search history.

(56) References Cited

U.S. PATENT DOCUMENTS

2002/0113595 A1 8/2002 Sakai et al.
2016/0233693 A1* 8/2016 Suzuki ...................... H02J 7/14

FOREIGN PATENT DOCUMENTS

JP 2002-238106 A 8/2002
JP 3747826 B2 2/2006
(Continued)

OTHER PUBLICATIONS

International Search Report (PCT/ISA/210) issued in PCT Application No. PCT/JP2017/014482 dated May 30, 2017 with English translation (two (2) pages).
(Continued)

*Primary Examiner* — Jacob B Marks
(74) *Attorney, Agent, or Firm* — Crowell & Moring LLP

(57) ABSTRACT

Provided is a battery control device that can achieve an improvement in computation accuracy of an internal resistance and an SOH. The battery control device includes an SOH computation unit which calculates an internal resistance value of a battery, and controls the battery on the basis of the internal resistance value calculated by the SOH computation unit. Then, an internal resistance computing determination unit calculates an index indicating a polarization voltage of the battery, and determines whether the index is equal to or more than a determination threshold. When the internal resistance computing determination unit determines that the index is equal to or more than the determination threshold, the battery is controlled on the basis of the internal resistance value calculated when the index is less than a determination threshold before the determination.

10 Claims, 24 Drawing Sheets

(51) Int. Cl.
    *G01R 31/389*     (2019.01)
    *G01R 31/374*     (2019.01)
    *B60L 3/00*     (2019.01)
    *H01M 10/42*     (2006.01)
    *H01M 10/48*     (2006.01)
    *H02J 7/00*     (2006.01)
    *B60L 50/60*     (2019.01)
    *B60L 58/12*     (2019.01)
    *B60W 10/26*     (2006.01)
    *B60K 6/28*     (2007.10)
    *B60W 20/13*     (2016.01)

(52) U.S. Cl.
    CPC ....... *G01R 31/3648* (2013.01); *G01R 31/374* (2019.01); *G01R 31/389* (2019.01); *H01M 10/42* (2013.01); *H01M 10/425* (2013.01); *H01M 10/48* (2013.01); *H02J 7/00* (2013.01); *B60K 6/28* (2013.01); *B60L 3/00* (2013.01); *B60W 10/26* (2013.01); *B60W 20/13* (2016.01); *H01M 2010/4271* (2013.01)

(56) References Cited

FOREIGN PATENT DOCUMENTS

| | | |
|---|---|---|
| JP | 2009-145065 A | 7/2009 |
| JP | 2015-227841 A | 12/2015 |

OTHER PUBLICATIONS

Japanese-language Written Opinion (PCT/ISA/237) issued in PCT Application No. PCT/JP2017/014482 dated May 30, 2017 (four (4) pages).

\* cited by examiner

FIG. 2

| SOC | 0 | 10  | ... | 90  | 100 |
|-----|---|-----|-----|-----|-----|
| OCV | 3 | 3.1 |     | 3.9 | 4   |

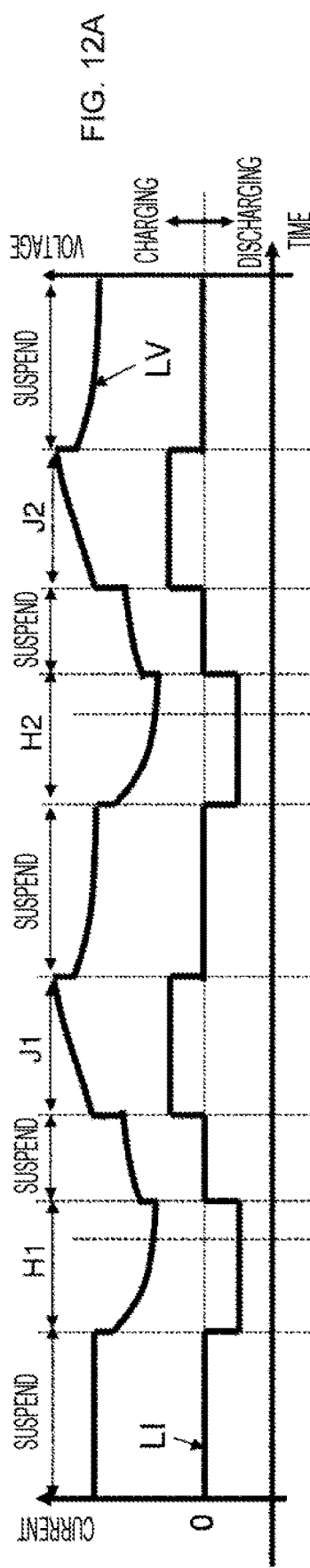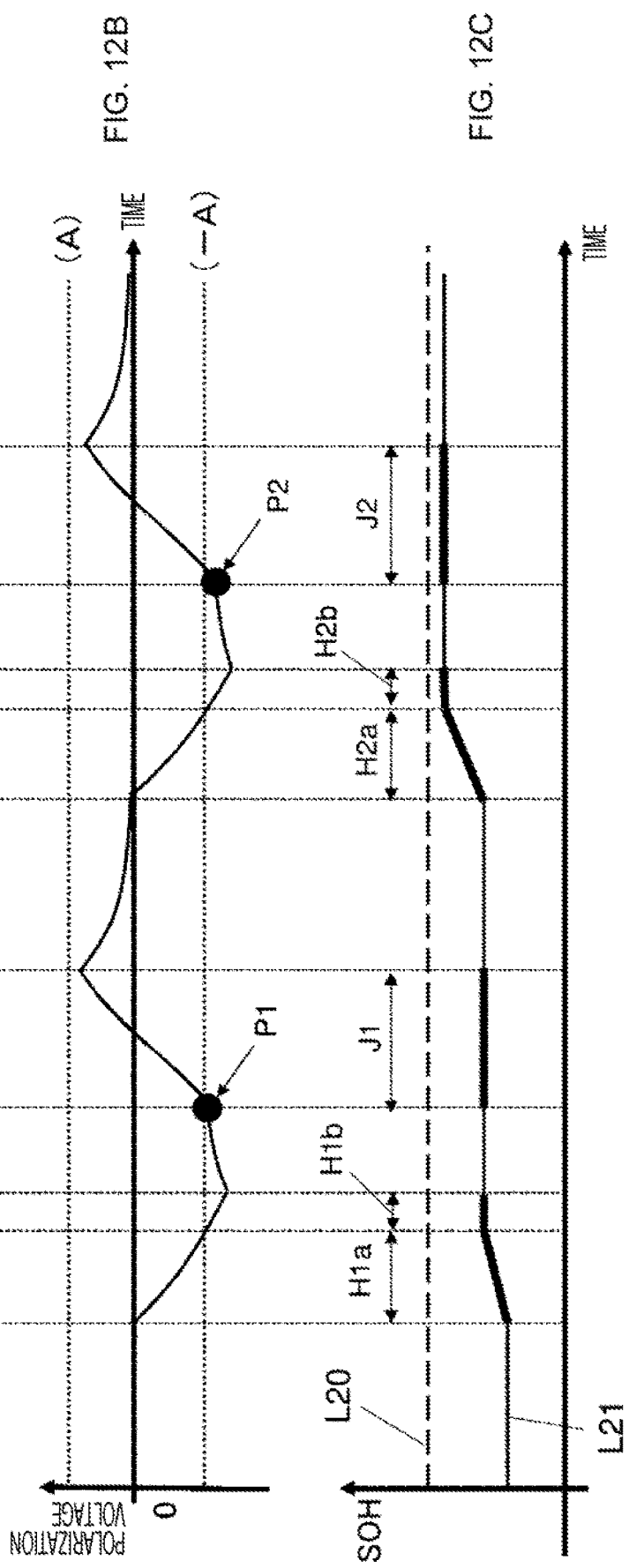

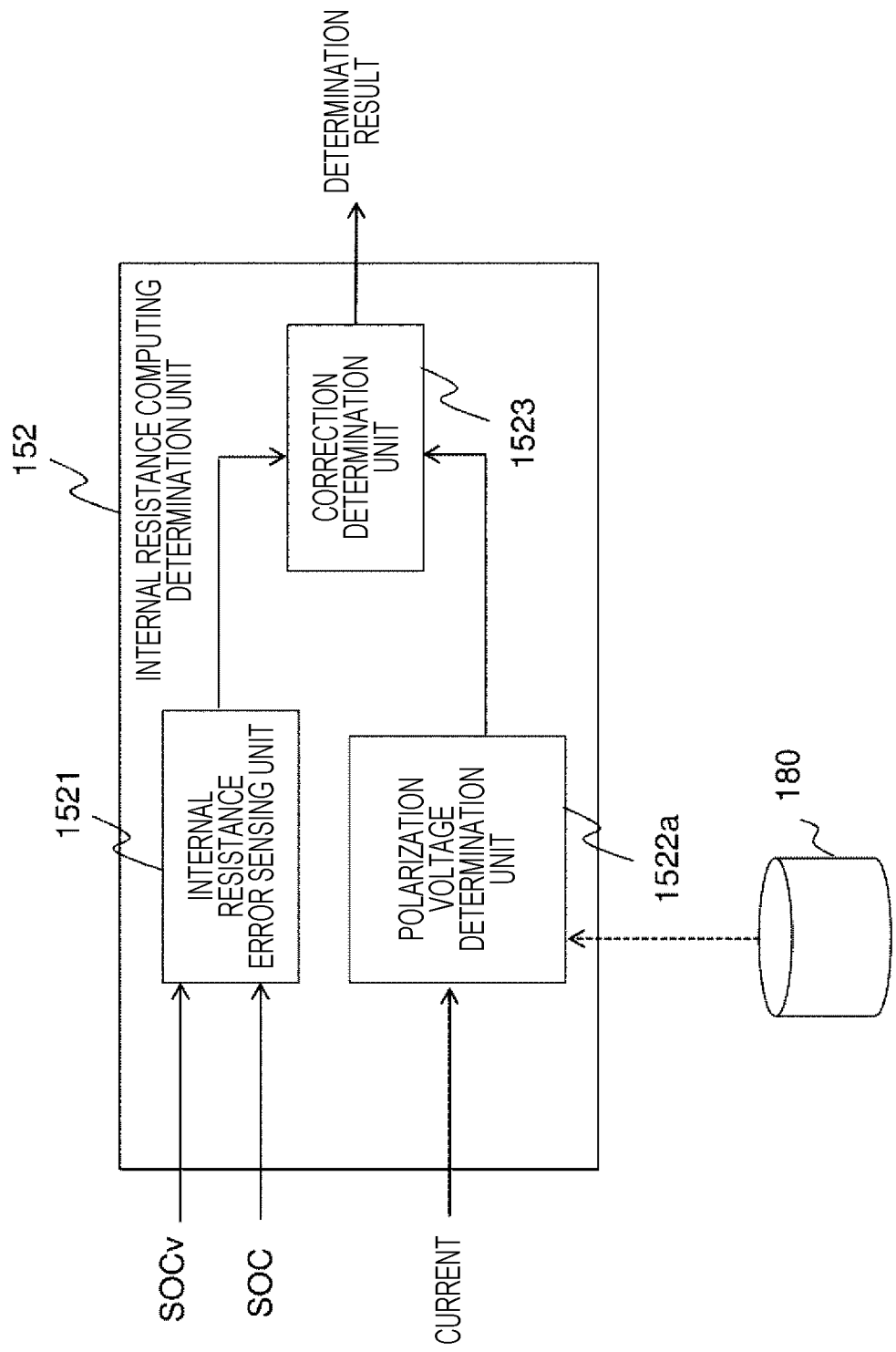

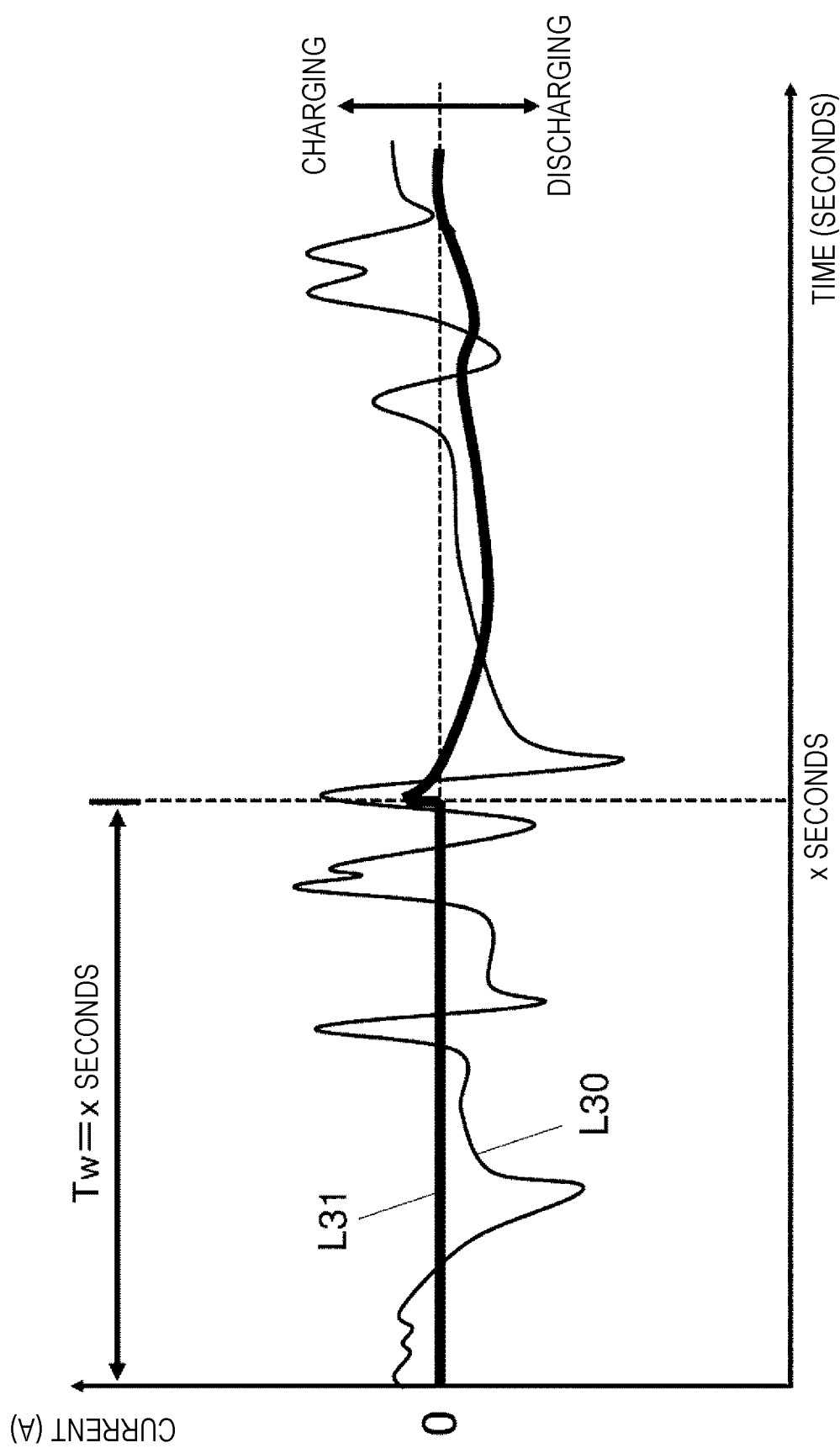

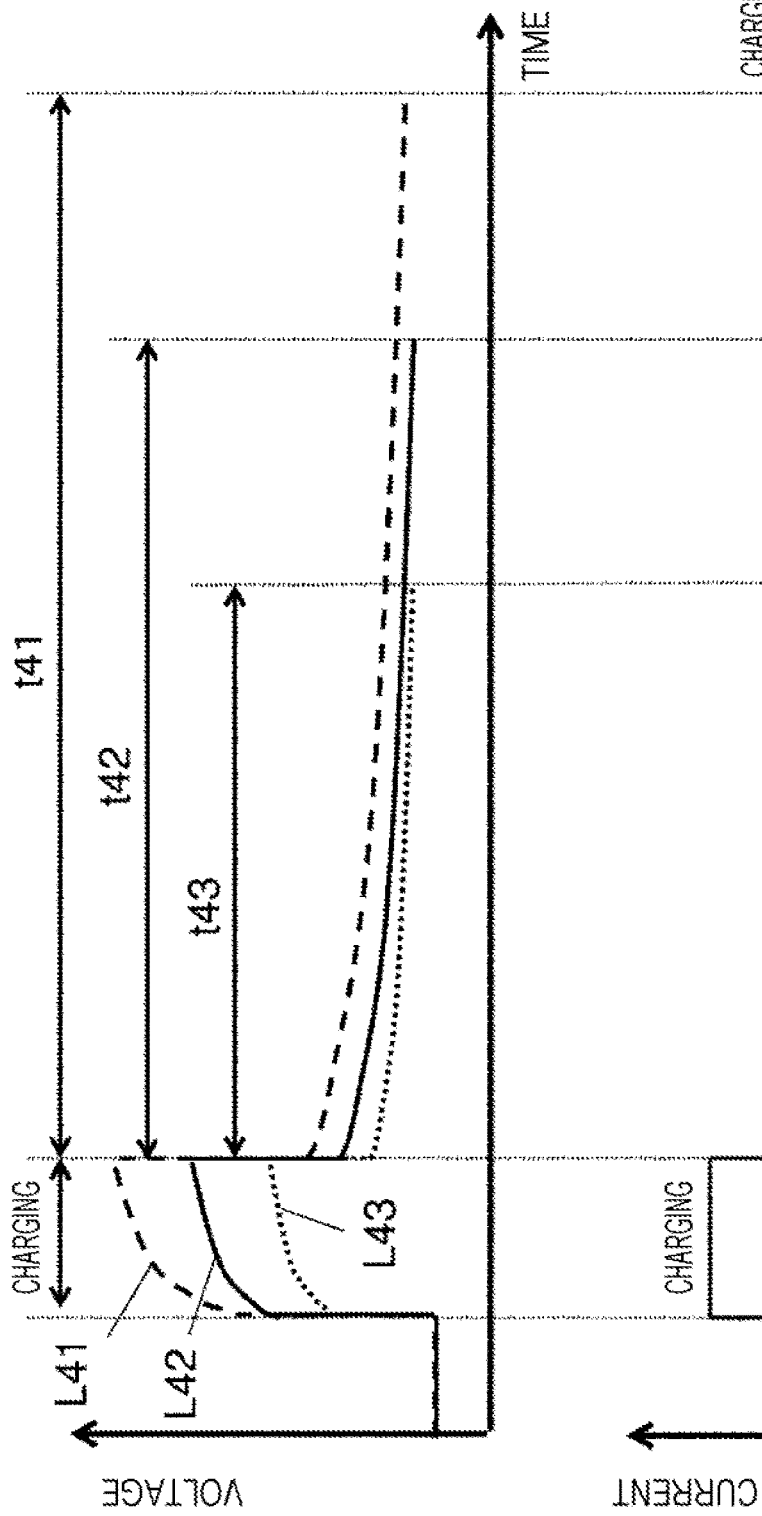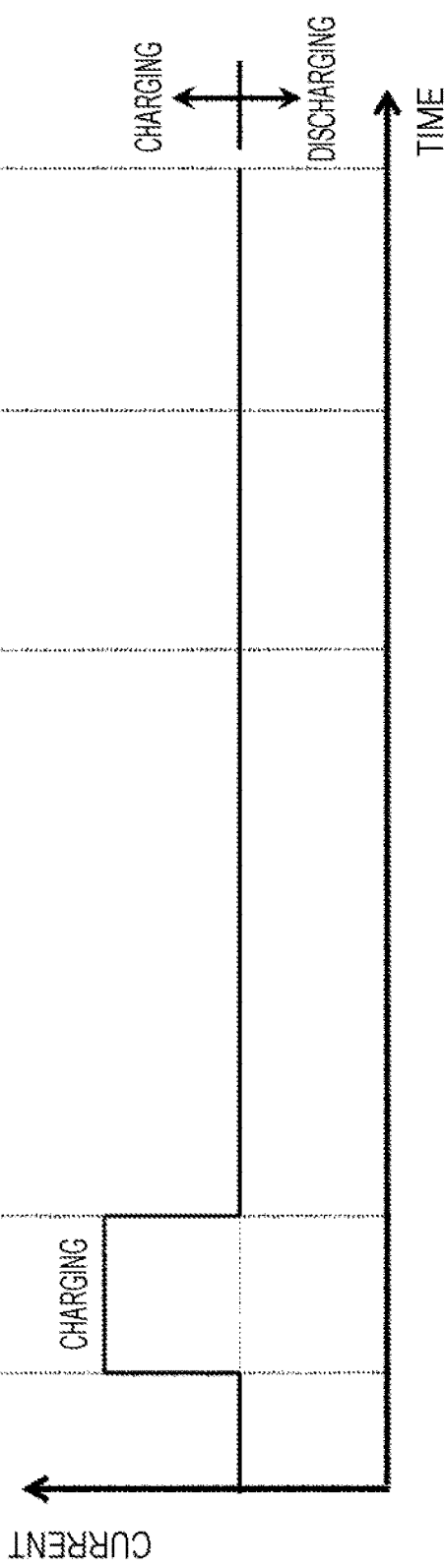

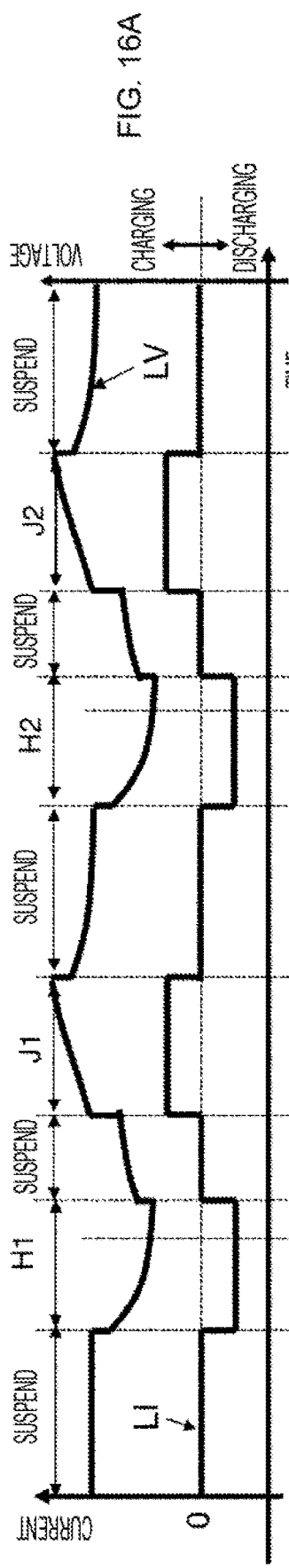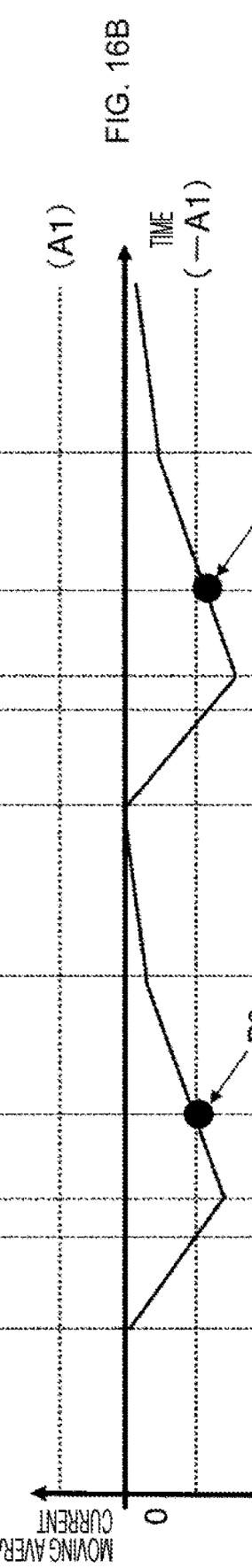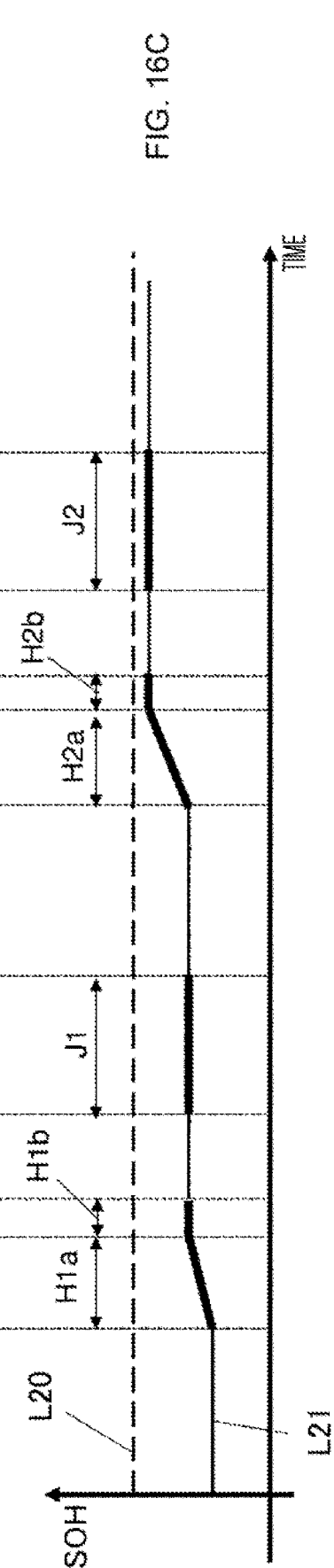

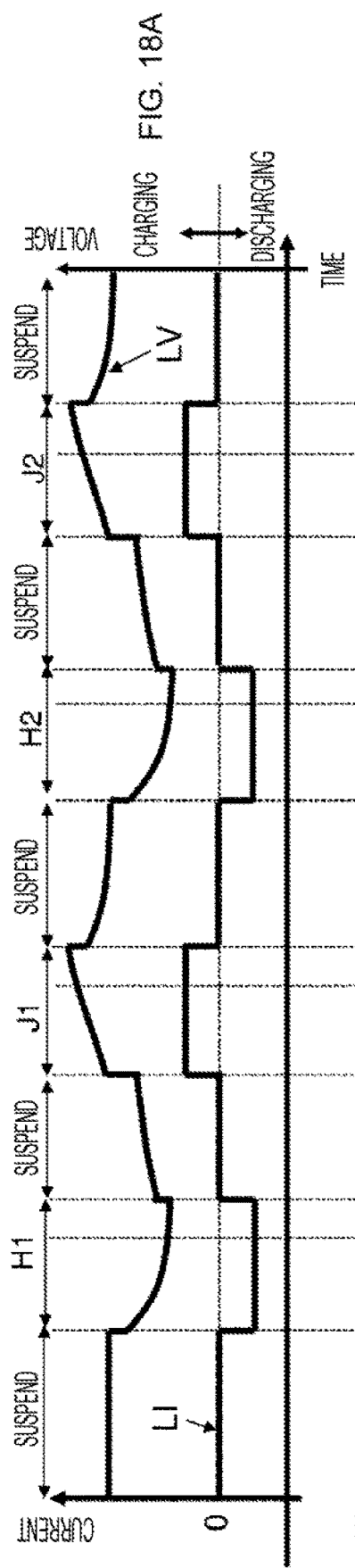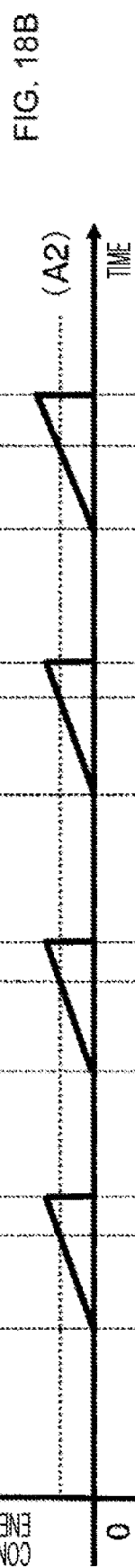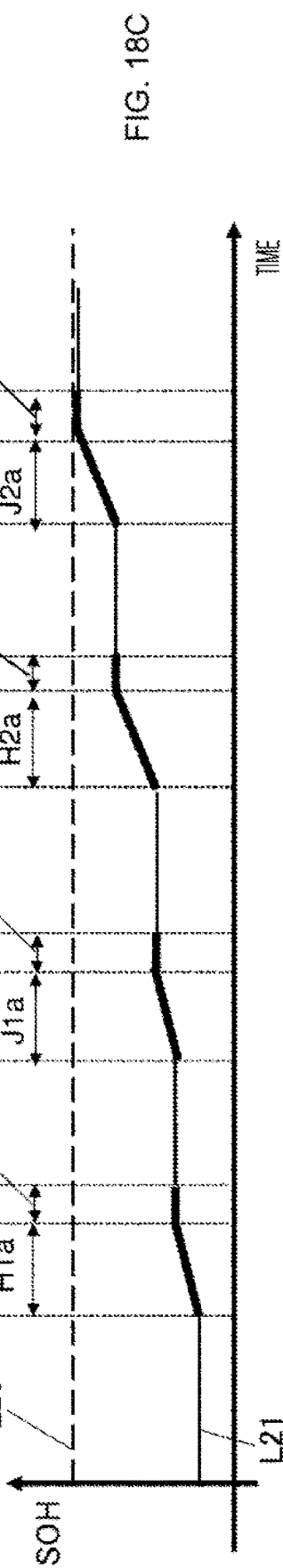

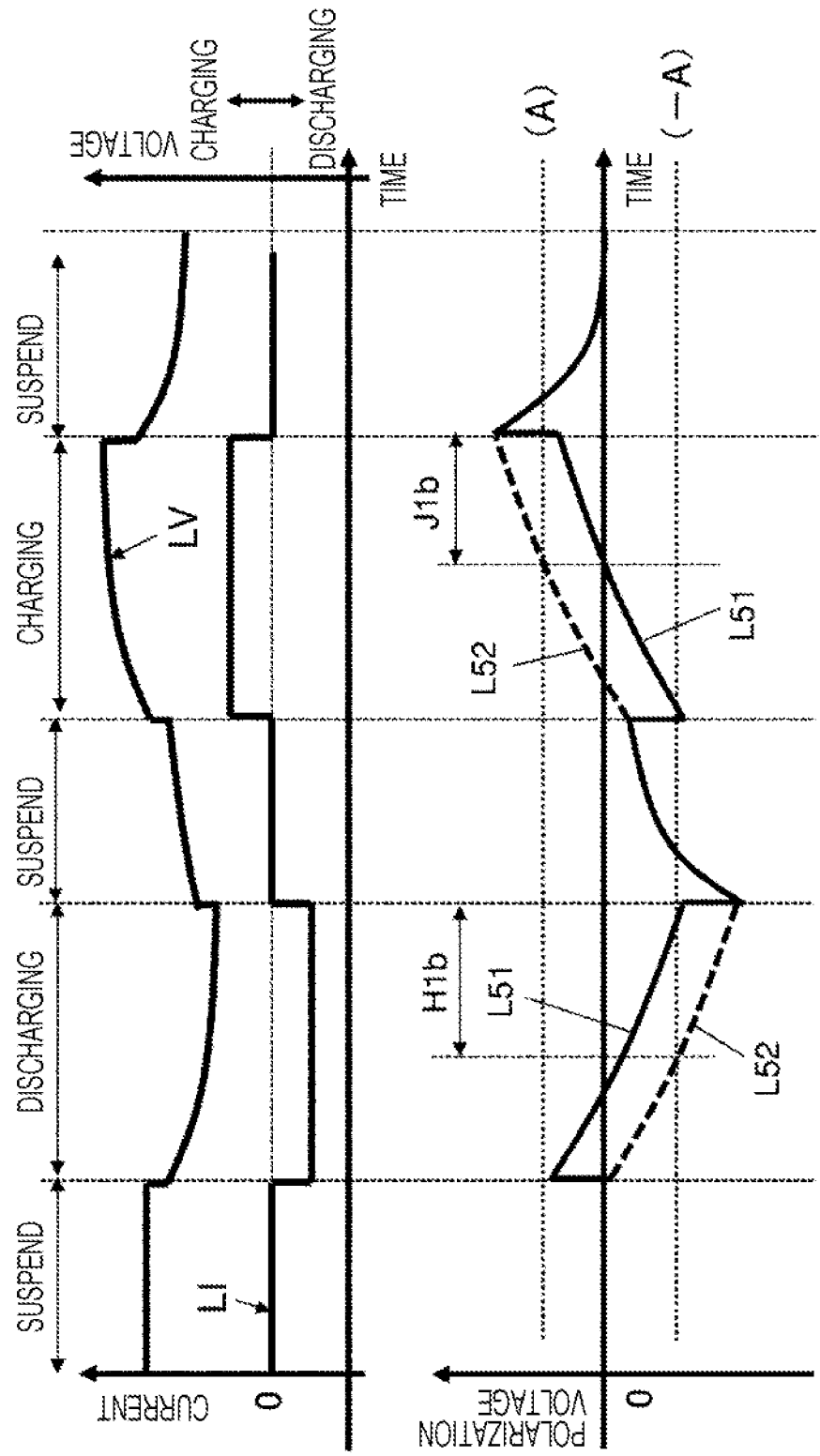

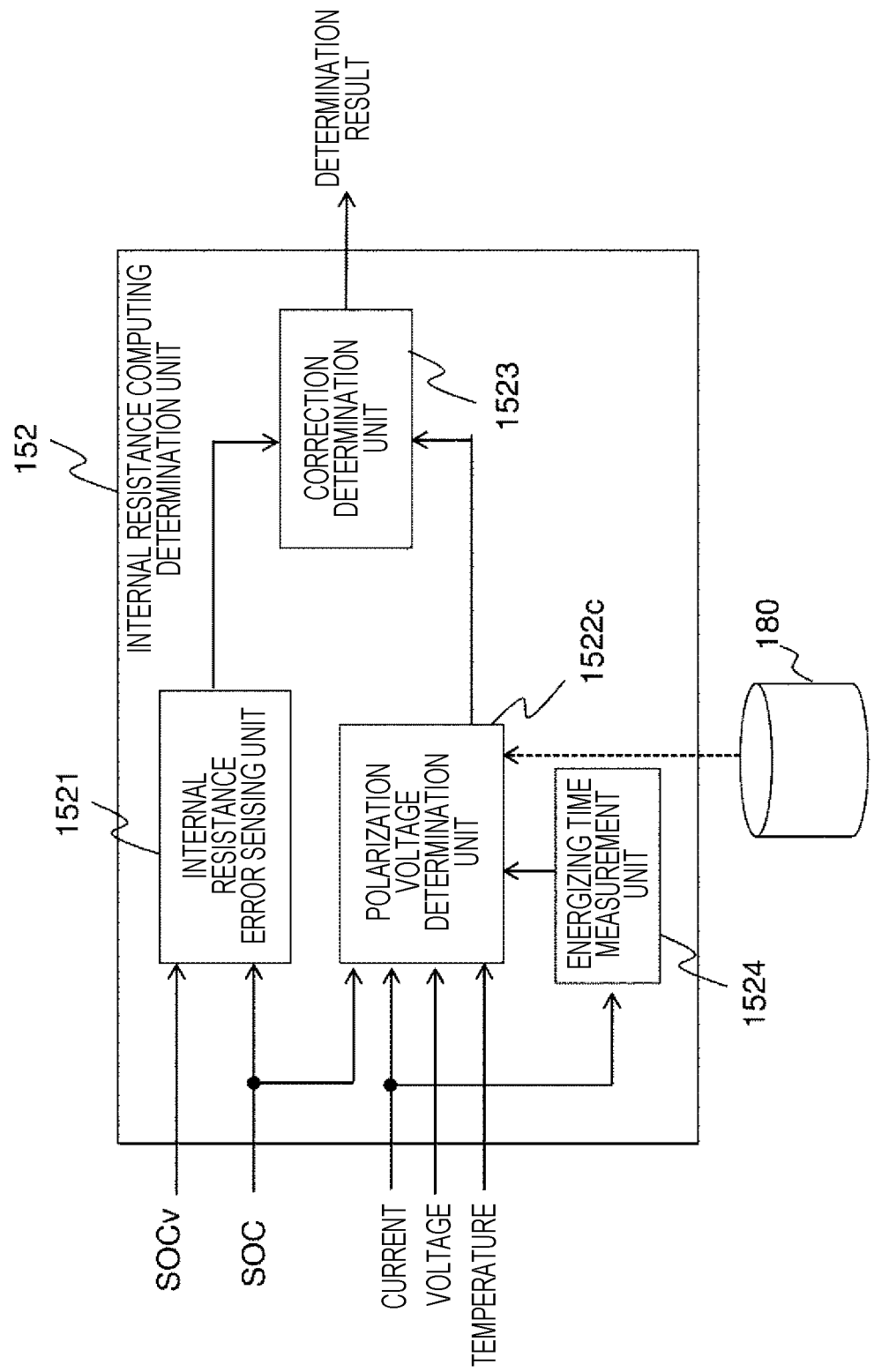

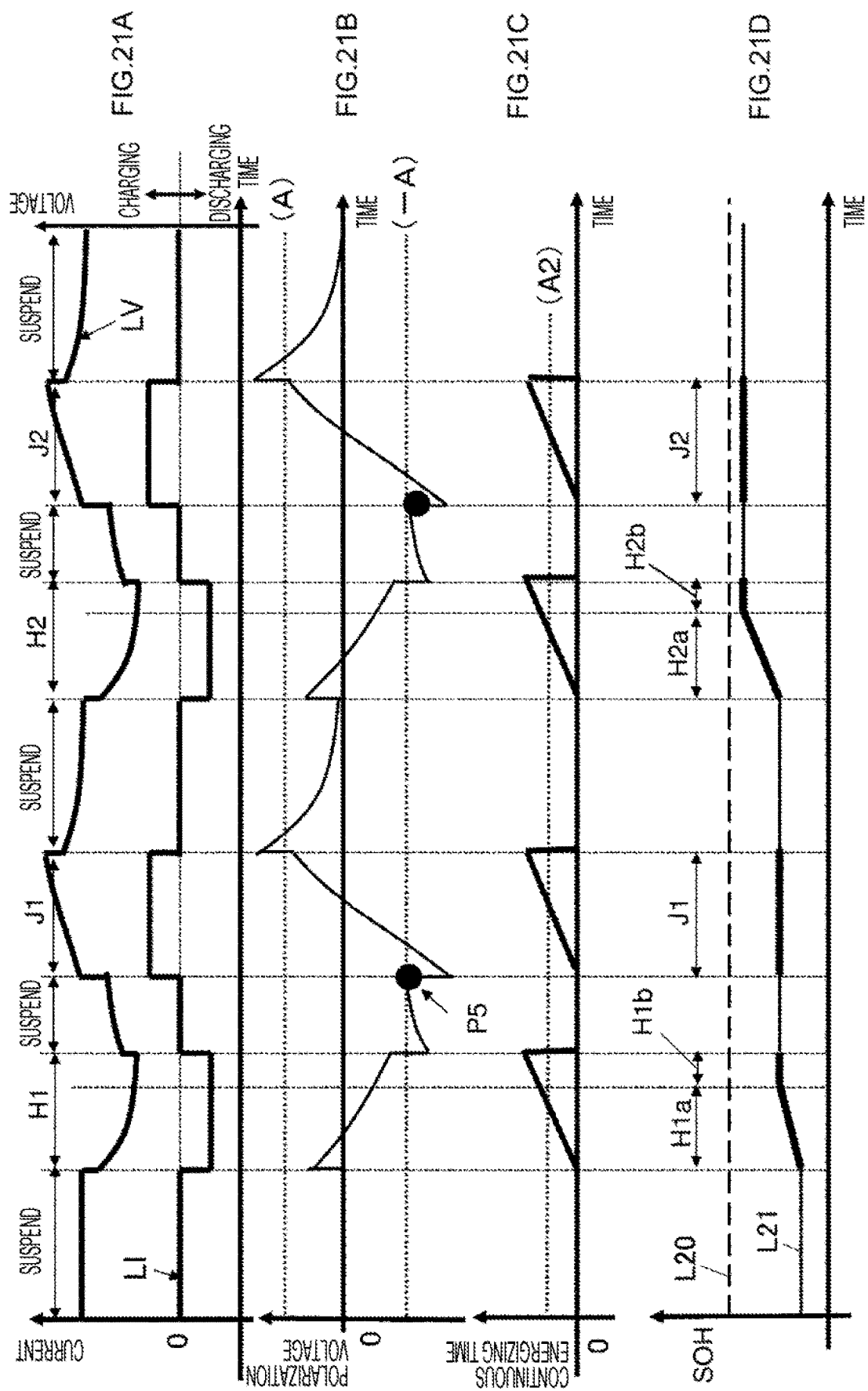

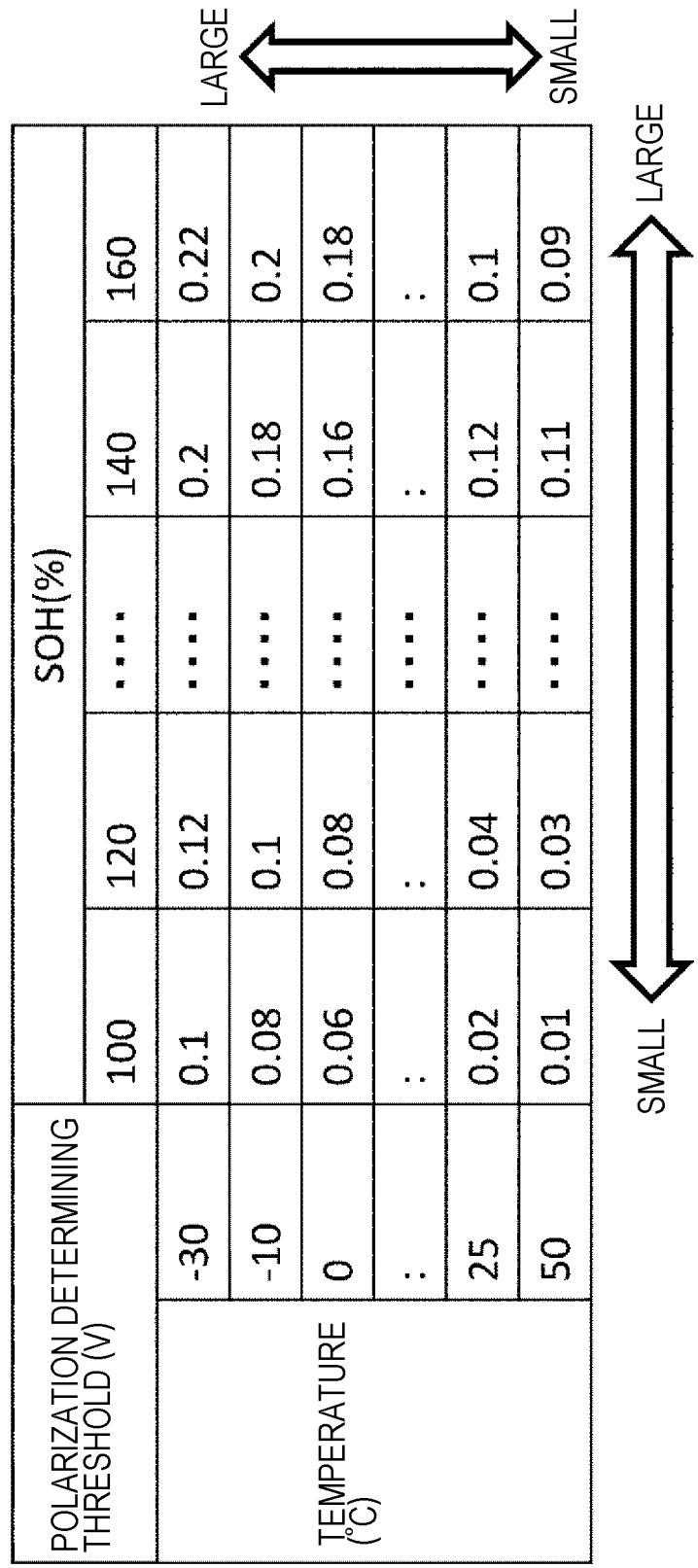

BATTERY CONTROL DEVICE

TECHNICAL FIELD

The present invention relates to a battery control device.

BACKGROUND ART

A battery system mounted in an electric motor vehicle such as an electric vehicle (EV), a plug-in hybrid electric vehicle (PHEV), and a hybrid electric vehicle (HEV) includes a battery control device in order to make a maximum performance of a battery. The battery control device detects a voltage, a temperature, and a current of the battery, and computes a state of charge (SOC), a state of health (SOH) of the battery, and an input/output power of the battery on the basis of the detected factors.

The battery is increased in internal resistance as it deteriorates. Therefore, an internal resistance value of the battery is computed in real time to appropriately compute the input/output power of the battery. Alternatively, a ratio of an initial internal resistance and an internal resistance after deteriorating is calculated as the SOH as a reference for battery replacement. As a method of computing the internal resistance of the battery, there are a method of calculating the internal resistance from a ratio of a variation amount of the voltage of the battery and a variation amount of the current, and a method of computing the internal resistance on the basis of an equivalent circuit model by modeling a resistance component of the battery.

In the method of computing the internal resistance on the basis of the latter equivalent circuit, there is a need to determine each circuit parameter (internal resistance value) of the equivalent circuit model which varies according to deterioration. Therefore, there is needed a method of extracting these circuit parameters with accuracy during charging/discharging. For example, PTL 1 discloses a technique of extracting each circuit parameter of the equivalent circuit model by an adaptive digital filter together with a current and a voltage during charging/discharging.

CITATION LIST

Patent Literature

PTL 1: JP 3747826 B2

SUMMARY OF INVENTION

Technical Problem

However, the internal resistance characteristics of the battery are viewed in various different ways according to a history (running pattern) of the current flowing to the battery and the deterioration. Therefore, an error caused by impossibility of the accurate modeling of the internal resistance characteristics of the battery is generated in the equivalent circuit model of the battery according to the history (running pattern) of the current. As a result, the internal resistance value (equivalent circuit parameter) and an SOH (index of deterioration) may not be computed with accuracy.

If the internal resistance characteristics are subjected to modeling with high accuracy in order to avoid the above problem, the equivalent circuit model is complicated, and there may be needed a process of high computation load. In addition, there is a need to acquire a battery parameter contained in a complicate equivalent circuit model whenever various types of material including positive or negative electrodes of the battery are changed. The number of man-hours for development becomes large.

Solution to Problem

According to an aspect of the present invention, a battery control device which includes an internal resistance computation unit configured to calculate an internal resistance value of a battery, and controls the battery on the basis of the internal resistance value calculated by the internal resistance computation unit, includes: an index computation unit which calculates an index indicating a polarization voltage of the battery; and a determination unit which determines whether the index is equal to or more than a determination threshold, wherein, when the determination unit determines that the index is equal to or more than the determination threshold, the battery is controlled on the basis of the internal resistance value which is calculated when the index is less than the determination threshold in a previous determination.

Advantageous Effects of Invention

According to the invention, it is possible to achieve an improvement of computation accuracy of an internal resistance and an SOH of a battery.

BRIEF DESCRIPTION OF DRAWINGS

FIG. 2 is a diagram illustrating an example of an SOC table.

FIG. 12 is a diagram FIGS. 12A-12C are diagrams illustrating an example of an SOH computation result.

FIG. 13 is a block diagram illustrating a configuration of the internal resistance computing determination unit in a second embodiment.

FIG. 14 is a diagram illustrating an example of a moving average value calculation.

FIGS. 15A and 15B are diagrams illustrating a relaxation behavior of a polarization voltage.

FIGS. 16A-16C are diagrams illustrating an example of an SOH computation result in the second embodiment.

FIGS. 18A-18C are diagrams illustrating an example of an SOH computation result in a third embodiment.

FIGS. 19A and 19B are diagrams illustrating a polarization voltage calculation value and a polarization voltage true value when powered up.

FIG. 20 is a diagram illustrating a configuration of the internal resistance computing determination unit in a fourth embodiment.

FIGS. 21A-21D are diagrams illustrating an example of an SOH computation result in the fourth embodiment.

FIG. 24 is a diagram illustrating an example of a data table of a polarization determining threshold in a sixth embodiment.

DESCRIPTION OF EMBODIMENTS

Hereinafter, embodiments of the invention will be described with reference to the drawings. In the embodiments described below, the description will be given about an example in a case where a storage device forming a power source of a hybrid electric vehicle (HEV) is applied.

The configuration of the embodiment described below may be applied even to a battery control circuit of a battery system forming a power source in a car such as a plug-in hybrid electric vehicle (PHEV) or an electric vehicle (EV) and an industrial vehicle such as a hybrid railway vehicle.

In the embodiment described below, the description will be given about an example in a case where a lithium ion battery is applied to a storage device of a storage unit. As a storage device, a nickel hydrogen battery, a lead battery, an electric double layered capacitor, and a hybrid capacitor may be used.

First Embodiment

A first embodiment of the invention will be described on the basis of FIGS. 1 to 14.

Figure 1:
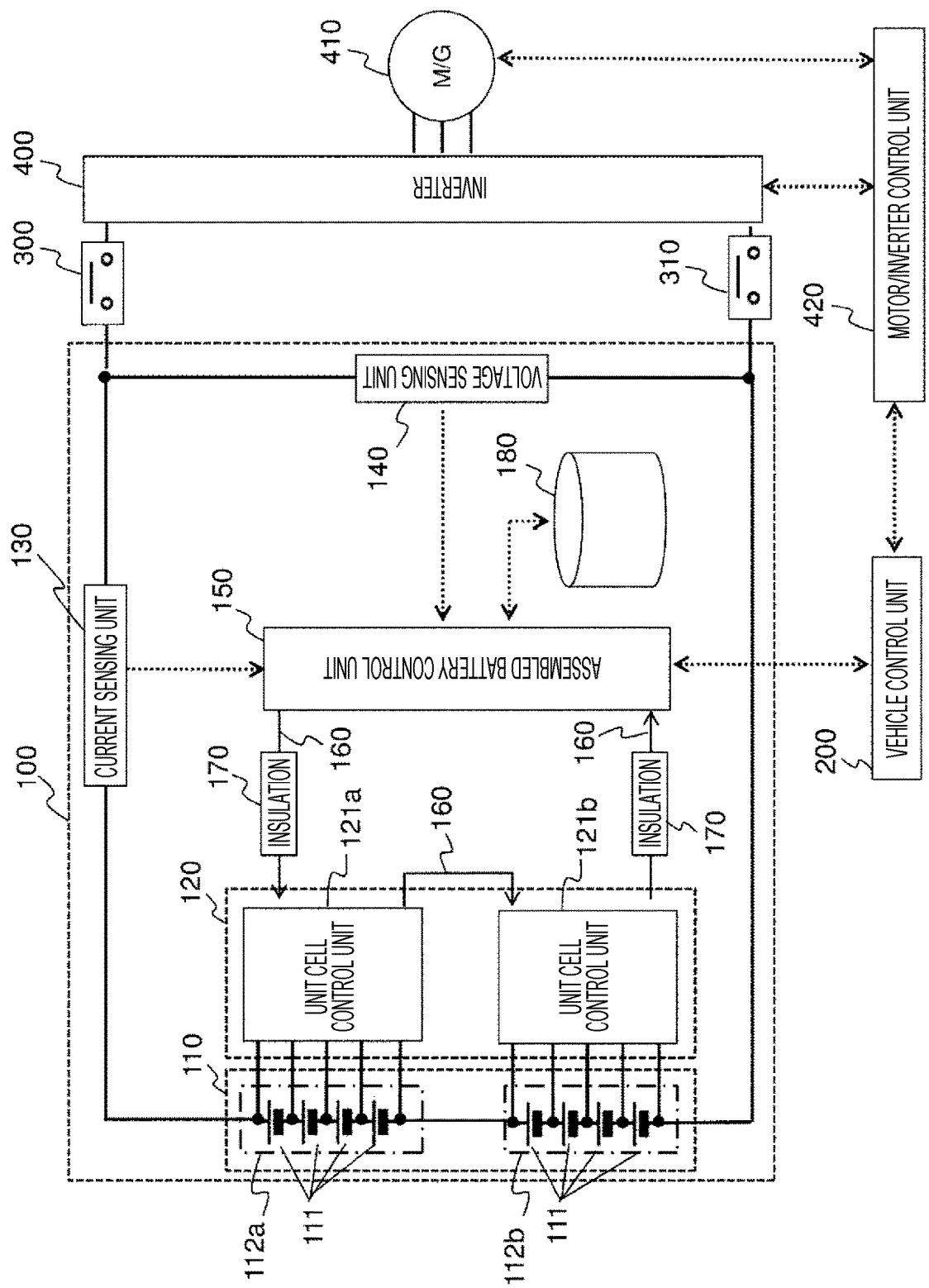
FIG. 1 is a diagram for describing a first embodiment.

FIG. 1 is a diagram for describing a battery control device of the first embodiment, in which an exemplary configuration of an electric motor system of the hybrid electric vehicle is illustrated. A battery system 100 is connected to an inverter 400 through relays 300 and 310. The inverter 400 supplies power from the battery system 100 to a motor generator 410. The inverter 400 and the motor generator 410 are controlled by a motor/inverter control unit 420. A vehicle control unit 200 determines how to distribute a driving force on the basis of battery information such as the SOC (State of Charge) of the battery system 100, information from the inverter 400 and the motor generator 410, and information from an engine (not illustrated).

The configuration of the battery system 100 will be described. The battery system 100 includes an assembled battery 110 configured by a plurality of unit cells 111, a unit cell management unit 120 which monitors the state of the unit cell 111, a current sensing unit 130 which senses a current flowing to the assembled battery 110, a voltage sensing unit 140 which senses a total voltage of the assembled battery 110, an assembled battery control unit 150 which controls the assembled battery 110, and a memory unit 180 which stores information related to a battery characteristic of the assembled battery 110, the unit cell 111, and a unit cell group 112.

Figure 6:
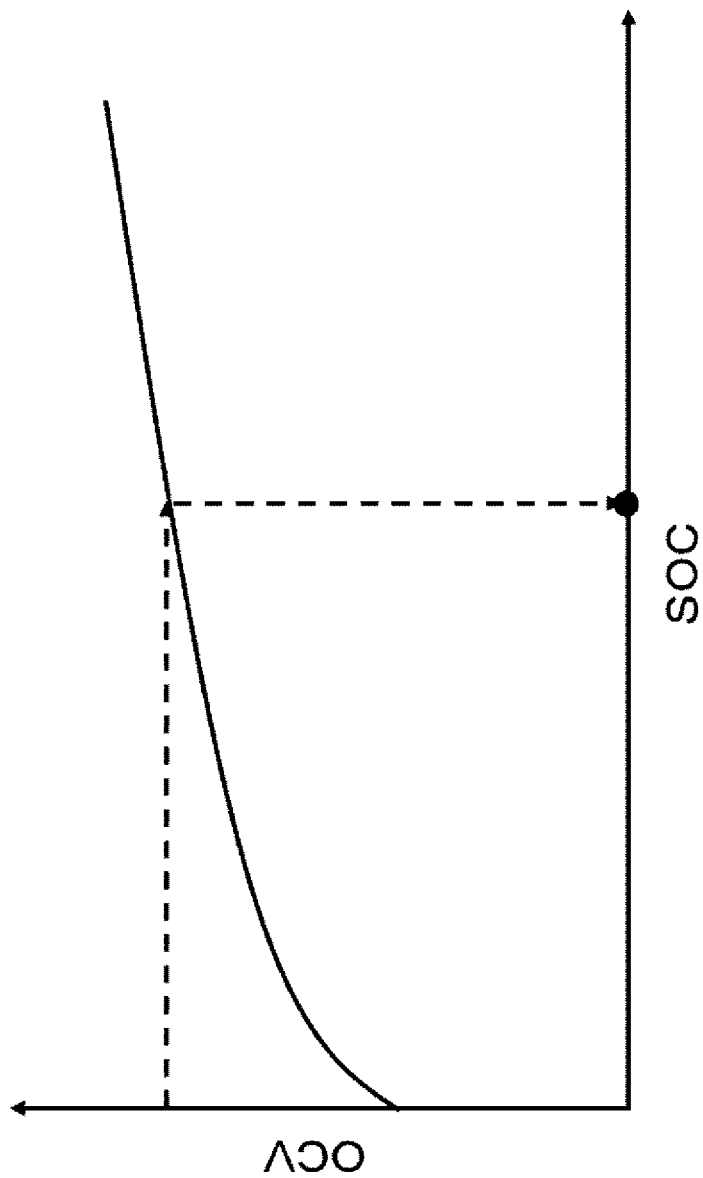
FIG. 6 is a diagram illustrating an example of a correspondence relation between SOC and OCV.

The assembled battery 110 is configured by electrically connecting a plurality of unit cells 111 (for example, a lithium ion battery) in series which can be charged and discharged (charging/discharging of DC power) with electric energy. The output voltage of one unit cell 111 is 3.0 to 4.2 V (average output voltage: 3.6 V). In this embodiment, the description will be given about an example in a case there is a correlation as illustrated in FIG. 6 between an open circuit voltage OCV (Open Circuit Voltage) and the SOC of the unit cell 111, but other voltage specifications may be applied.

In the unit cell 111 forming the assembled battery 110, the management of the state and the control of the unit cell 111 are performed by a predetermined number of groups. In the example illustrated in FIG. 1, the unit cells are divided into two unit cell groups 112a and 112b. The unit cells 111 divided into groups are electrically connected in series, and form the unit cell group 112. The predetermined number of unit cells may be 1, 4, 6, and so on for example. Alternatively, the unit cells may be divided into plural sections such as a combination of 4 and 6. In the example illustrated in FIG. 1, the predetermined number of unit cells is 4.

The unit cell management unit 120 monitors the state of the unit cells 111 which form the assembled battery 110 as described above. The unit cell management unit 120 is configured by a plurality of unit cell control units 121a and 121b. One unit cell control unit 121 is assigned to the unit cell group 112 which is grouped as described above. The unit cell control unit 121 receives the power from the assigned unit cell group 112 and operates. The unit cell control unit 121 monitors a battery voltage and a temperature of the unit cells 111 which form the unit cell group 112.

In FIG. 1, the unit cell control unit 121a and the unit cell control unit 121b are provided in correspondence with the unit cell group 112a and the unit cell group 112b. In this embodiment, for the sake of simplicity in the description, the unit cell group 112 is assumed to be configured such that four unit cells 111 are electrically connected in series. Further, four unit cells 111 are configured to be monitored by one unit cell control unit 121.

The assembled battery control unit 150 receives the voltage and the temperature of the battery of the unit cell 111 transmitted from the unit cell management unit 120, a current value flowing to the assembled battery 110 transmitted from the current sensing unit 130, a total voltage value of the assembled battery 110 transmitted from the voltage sensing unit 140, a diagnosis result of whether the unit cell 111 is over-charged or over-discharged or an abnormal signal which is output in a case where there occurs a communication error in the unit cell management unit 120. The assembled battery control unit 150 detects the state of the assembled battery 110 on the basis of the input information. In addition, a result obtained by the process of the assembled battery control unit 150 is transmitted to the unit cell management unit 120 and the vehicle control unit 200.

The assembled battery control unit 150 and the unit cell management unit 120 transfer signals by a signal communication unit 160. An insulation element 170 such as a photocoupler is provided in the signal communication unit 160. The reason why the insulation element 170 is provided is because the operation power source is different in the assembled battery control unit 150 and the unit cell management unit 120. As described above, the unit cell management unit 120 is operated by the power from the assembled battery 110, but the assembled battery control unit 150 uses a battery (for example, 12 V battery) for an in-vehicle auxiliary as a power source. The insulation element 170 may be mounted in a circuit board of the unit cell management unit 120, or may be mounted in a circuit board of the assembled battery control unit 150. Further, the insulation element 170 may be omitted according to a system configuration.

The communication between the assembled battery control unit 150 and the unit cell control units 121*a* and 121*b* will be described. The unit cell control units 121*a* and 121*b* are connected in series in a descending order of the potentials of the unit cell groups 112*a* and 112*b* which are monitored respectively. A signal transmitted by the assembled battery control unit 150 is input to the unit cell control unit 121*a* by the signal communication unit 160 in which the insulation element 170 is provided. The output of the unit cell control unit 121*a* and the input of the unit cell control unit 121*b* are connected by the signal communication unit 160. The signal communication unit 160 transfers the signal. Further, in this embodiment, the insulation element 170 is not provided between the unit cell control unit 121*a* and the unit cell control unit 121*b*. However, the insulation element 170 may be provided.

The output signal from the unit cell control unit 121*b* is transferred to an input portion of the assembled battery control unit 150 by the signal communication unit 160 in which the insulation element 170 is provided. In this way, the assembled battery control unit 150 and the unit cell control units 1211*a* and 121*b* are connected in a loop shape by the signal communication unit 160. The loop connection may be called a daisy chain connection, a linking connection, or a serial connection.

The memory unit 180 stores information such as the internal resistance characteristics, capacities in full charge, polarization resistance characteristics, deterioration characteristics, individual difference information, and a correspondence relation (SOC table) between the SOC and the OCV of the assembled battery 110, the unit cell 111, and the unit cell group 112. Further, in this embodiment, the memory unit 180 is configured to be installed outside the assembled battery control unit 150 or the unit cell management unit 120. However, the memory unit 180 may be provided in the assembled battery control unit 150 or the unit cell management unit 120.

Figure 2:
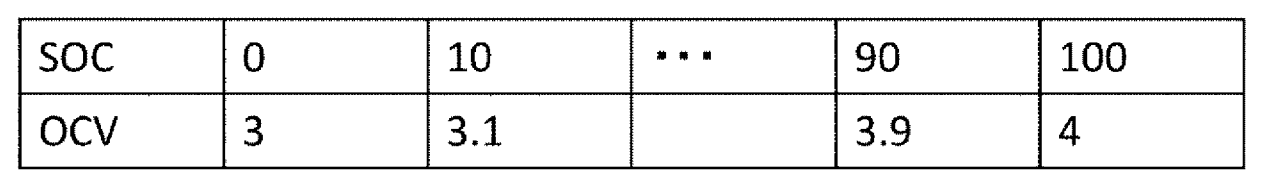

FIG. 2 is a diagram illustrating an example of the SOC table which is stored in the memory unit 180. The SOC table is a data table to describe a correspondence relation between the OCV of the unit cell 111 and the SOC of the unit cell 111 according to temperature. Similarly to the SOC table, the memory unit 180 also stores various types of battery characteristic information such as the internal resistance characteristics and the polarization resistance characteristics as a data table which describes a correspondence relation with respect to various types of parameters such as the SOC and the temperature. Further, in this embodiment, the data table is used as the correspondence relation between the OCV and the SOC. However, the correspondence relation between the OCV and the SOC may be expressed by a mathematical expression, and not limited to a format such as the data table.

Figure 3:
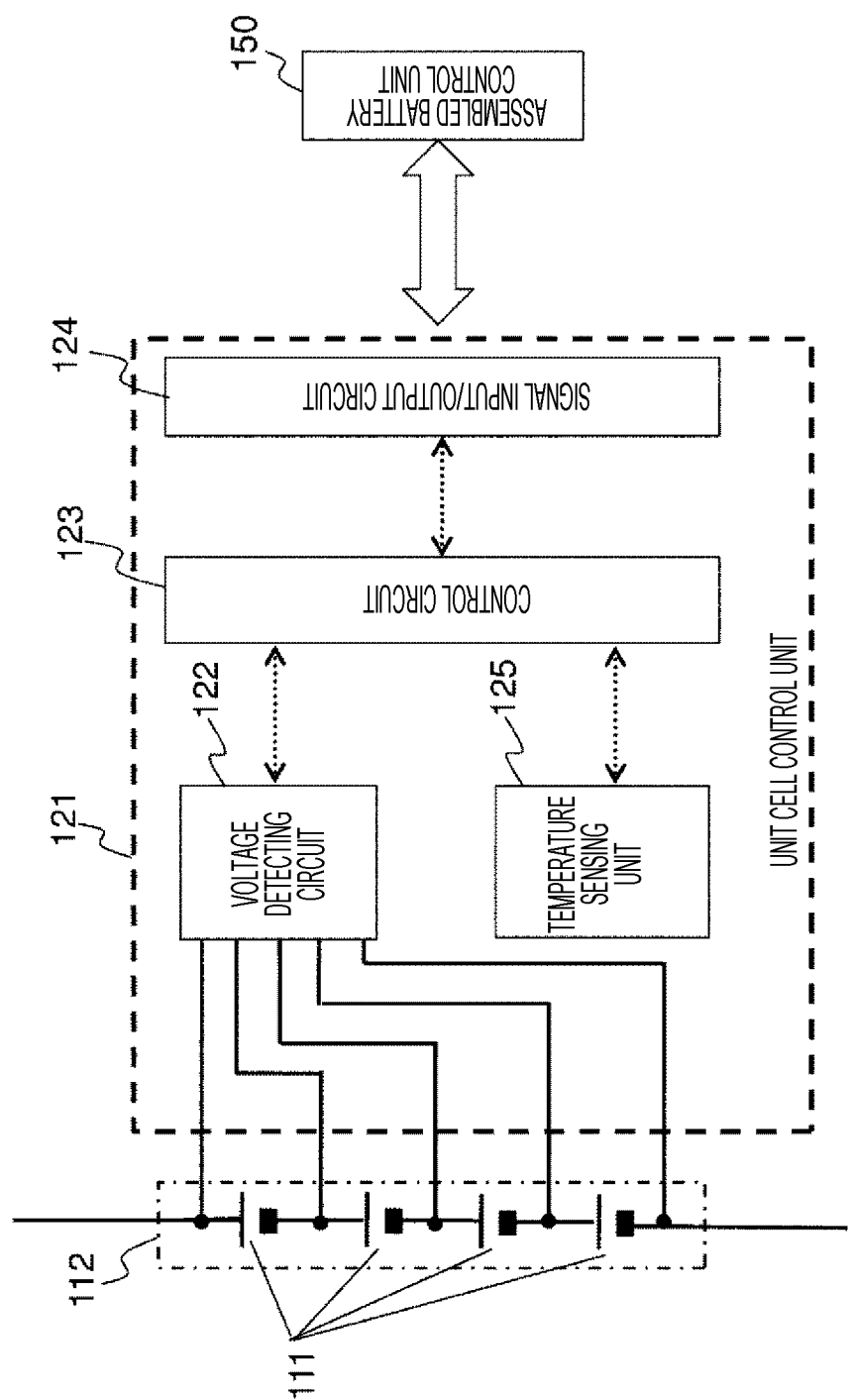
FIG. 3 is a diagram illustrating a circuit configuration of a unit cell control unit.

FIG. 3 is a diagram illustrating a circuit configuration of the unit cell control unit 121. The unit cell control unit 121 includes a voltage detecting circuit 122, a control circuit 123, a signal input/output circuit 124, and a temperature sensing unit 125. The voltage detecting circuit 122 measures a voltage between the terminals of each unit cell 111. The temperature sensing unit 125 measures a temperature of the unit cell group 112. The control circuit 123 receives measurement results from the voltage detecting circuit 122 and the temperature sensing unit 125, and transmits the measurement results to the assembled battery control unit 150 through the signal input/output circuit 124.

Further, in general, the unit cell control unit 121 includes a circuit configuration to equalize a variation in voltage and the SOC between the unit cells 111 which is caused by a self-discharge and a variation in consumption current. However, such a circuit configuration is already known well, and thus is omitted in FIG. 2.

The temperature sensing unit 125 measures one temperature of the entire unit cell group 112, and handles the temperature as a representative temperature of the unit cells 111 of the unit cell group 112. Therefore, one temperature sensing unit 125 is provided in the unit cell control unit 121. The temperature measured by the temperature sensing unit 125 is used in various types of computation to sense the state of the unit cell 111, the unit cell group 112, or the assembled battery 110. Further, the temperature sensing unit 125 may be provided in each unit cell 111 to measure the temperature of each unit cell 111, and various types of computation may be performed on the basis of the temperature of each unit cell 111. However, in this case, since the number of temperature sensing units 125 is large, the configuration of the unit cell control unit 121 becomes complicate by the number.

In FIG. 3, the temperature sensing unit 125 is illustrated simply. In practice, a temperature sensor is installed in a temperature measurement target, and the temperature sensor outputs the temperature information as a voltage. The measurement result is transmitted to the signal input/output circuit 124 through the control circuit 123. The signal input/output circuit 124 outputs the measurement result to the outside of the unit cell control unit 121. A function of realizing such a series of flow is mounted in the unit cell control unit 121 as the temperature sensing unit 125. Further, the voltage detecting circuit 122 may be used to measure the temperature information (voltage).

Figure 4:
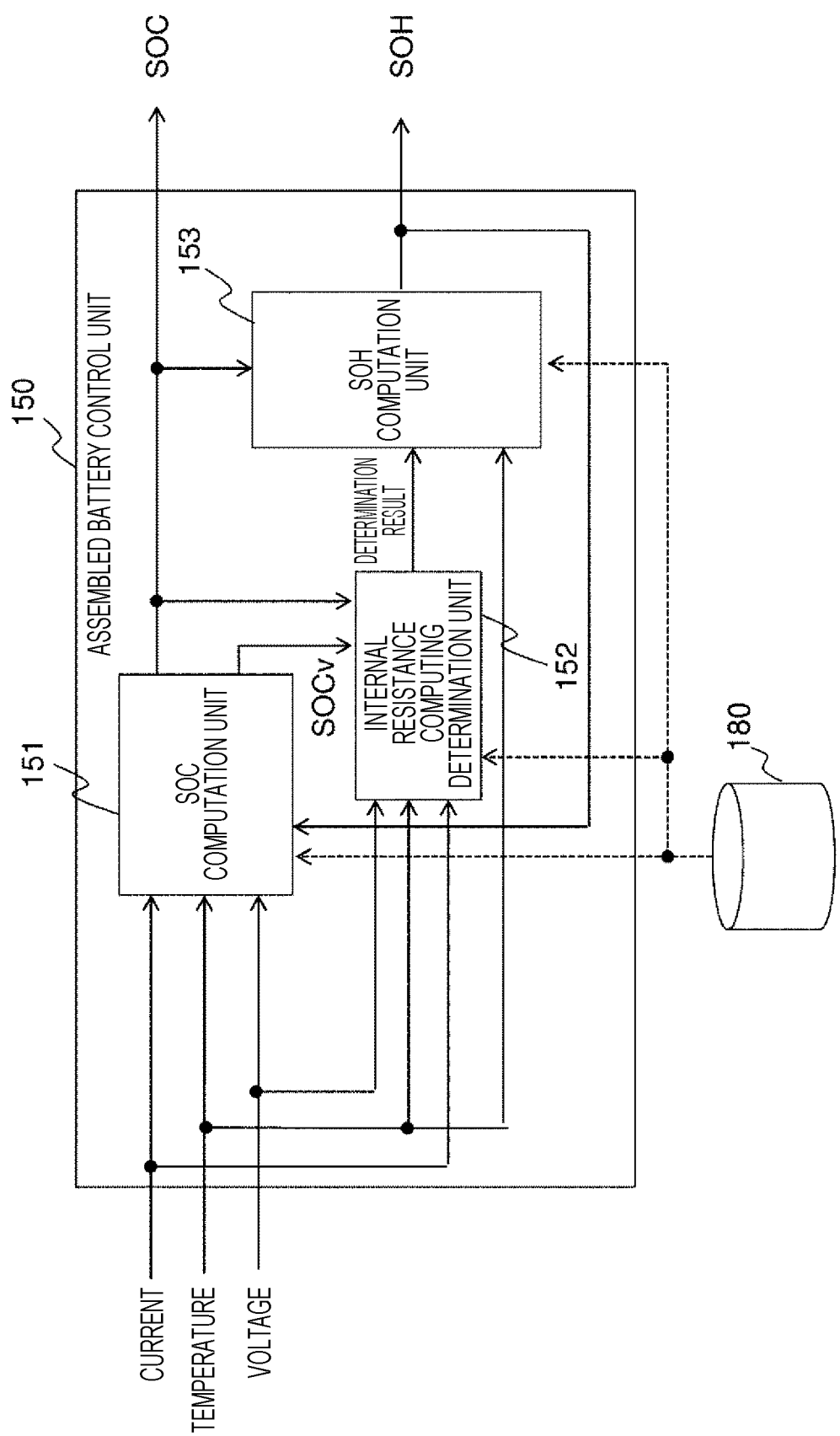
FIG. 4 is a block diagram illustrating a configuration of an assembled battery control unit.

FIG. 4 is a block diagram illustrating a configuration of the assembled battery control unit 150. Further, in FIG. 4, a configuration of an SOC computation and an SOH computation related to the battery control in this embodiment. For the sake of simplicity, configurations of a diagnosis process on the unit cell 111 performed by the assembled battery control unit 150, and a process based on the abnormal signal output in a case where there occurs a communication error in the unit cell management unit 120 are omitted in the drawing and the description.

The assembled battery control unit 150 includes an SOC computation unit 151, an internal resistance computing determination unit 152, and an SOH computation unit 153. The SOC computation unit 151 receives the voltage of the unit cells 111 of the assembled battery 110 (an average voltage of the unit cells 111), the current flowing to the assembled battery 110, the temperature of the assembled battery 110, and the SOH (State of Health) output by the SOH computation unit 153. The SOC computation unit 151 computes and outputs the SOC and the SOCv on the basis of these inputs. The computation processing of the SOC and the SOCv will be described below.

The internal resistance computing determination unit 152 receives the voltage of the unit cells 111 of the assembled battery 110, the current flowing to the assembled battery 110, the temperature of the assembled battery 110, the SOC, the SOCv, and the SOH. The internal resistance computing determination unit 152 determines whether the SOH computation is performed or not on the basis of these inputs. Further, the SOC and the SOH computed in the assembled battery control unit 150 are transmitted to the vehicle control unit 200.

Figure 5:
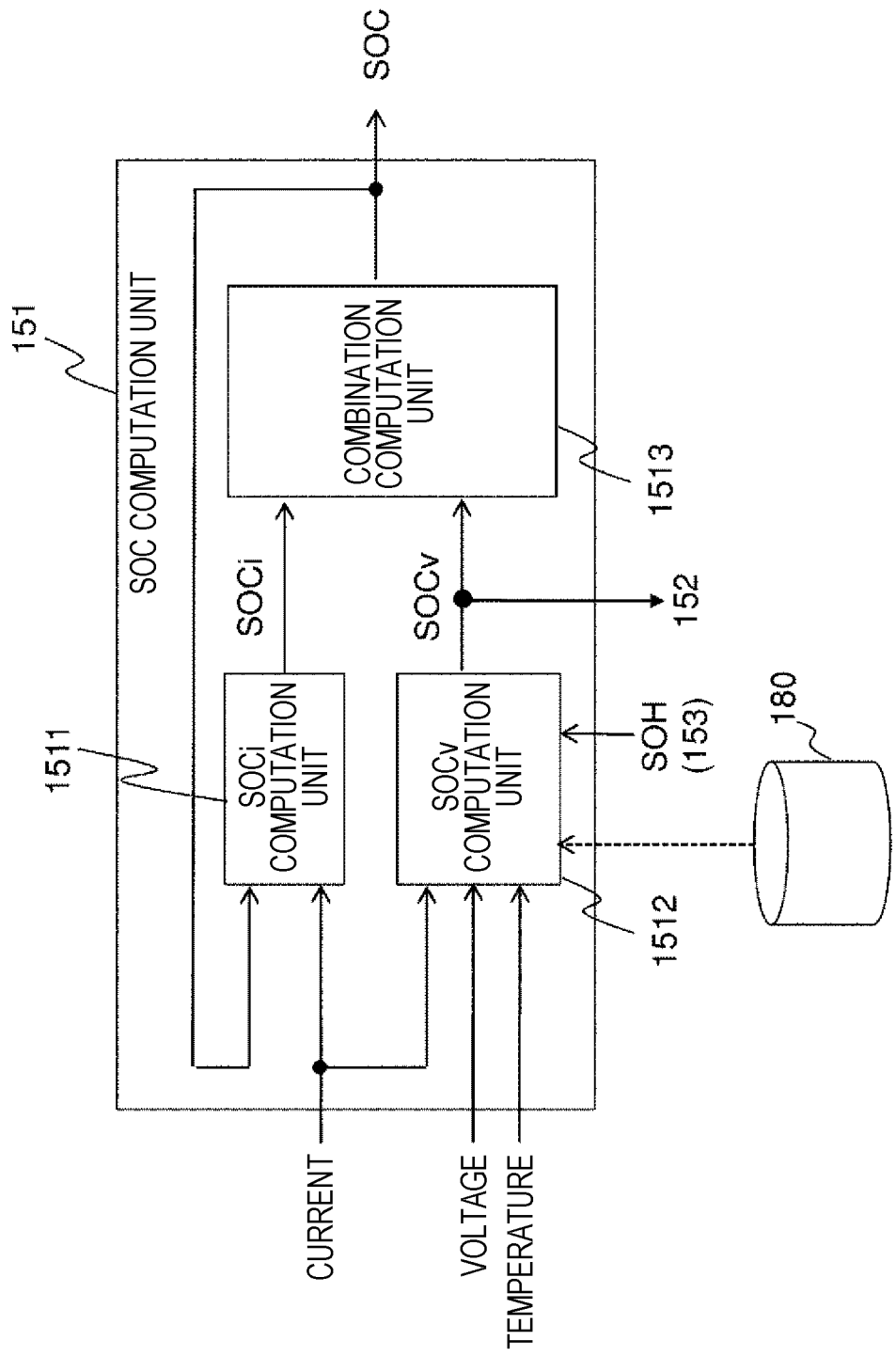
FIG. 5 is a block diagram illustrating a configuration of an SOC computation unit.

FIG. 5 is a block diagram illustrating a configuration of the SOC computation unit 151. The SOC computation unit 151 includes an SOCi computation unit 1511, an SOCv computation unit 1512, and a combination computation unit 1513.

On the basis of the input current and a previous value (a calculation result before one cycle) of the SOC computation result output from the combination computation unit 1513 (a computation result before one cycle), the SOCi computation unit 1511 computes the SOC (hereinafter, referred to as SOCi) based on an integrated value of the current. The SOCi is calculated by the following Expression (1). In Expression (1), "SOCold" represents a previous value (a computation result before one cycle) of the SOC calculated by Expression (8) described below. In addition, "ΔSOC" represents a change amount of the SOC by the current I flowing from the previous computation until the present computation. "Qmax" represents a full-charge capacity of the unit cell 111, and "ts" represents a control cycle (a sampling cycle of current and voltage).

$$SOCi = SOCold + \Delta SOC \quad (1)$$

wherein, $\Delta SOC = 100 \times I \times ts / Qmax$.

The SOCv computation unit 1512 computes the OCV on the basis of the input voltage, current, and temperature, and computes the SOC (hereinafter, referred to as SOCv) corresponding to the computed OCV from the computed OCV and a correspondence relation illustrated in FIG. 6.

Figure 7:
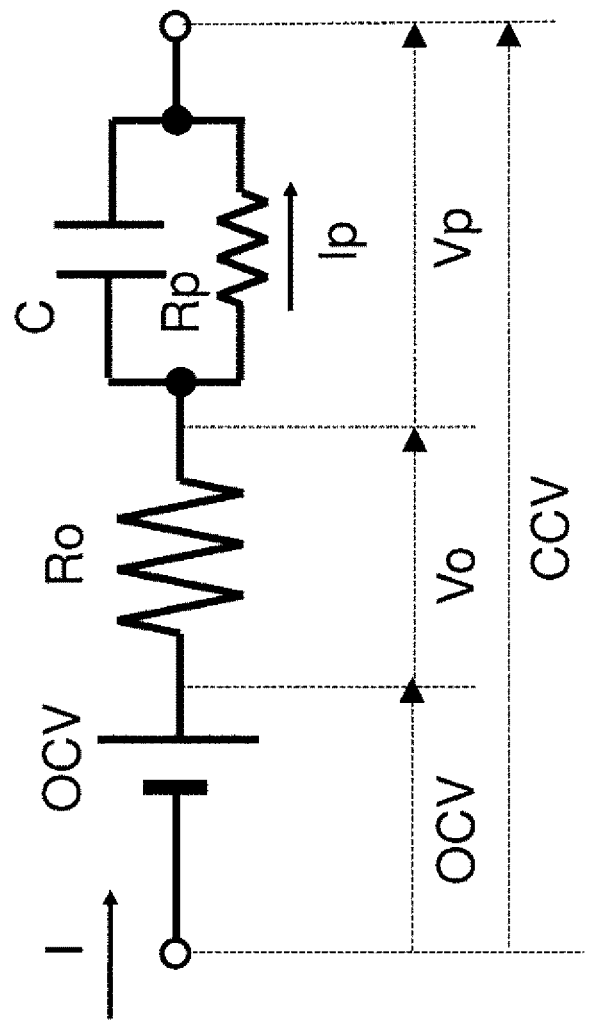
FIG. 7 is a diagram illustrating an equivalent circuit of a unit cell.

FIG. 7 is a diagram illustrating an equivalent circuit of the unit cell 111. The unit cell 111 is a circuit configuration in which a pseudo DC power source of the OCV indicating the open circuit voltage of the battery, Ro indicating an electrical resistance such as an electrode and an electrolytic solution, and a parallel circuit of Rp and C modeling a resistance component (polarization component) corresponding to an electrochemical reaction of the battery are connected in series.

Figure 8:
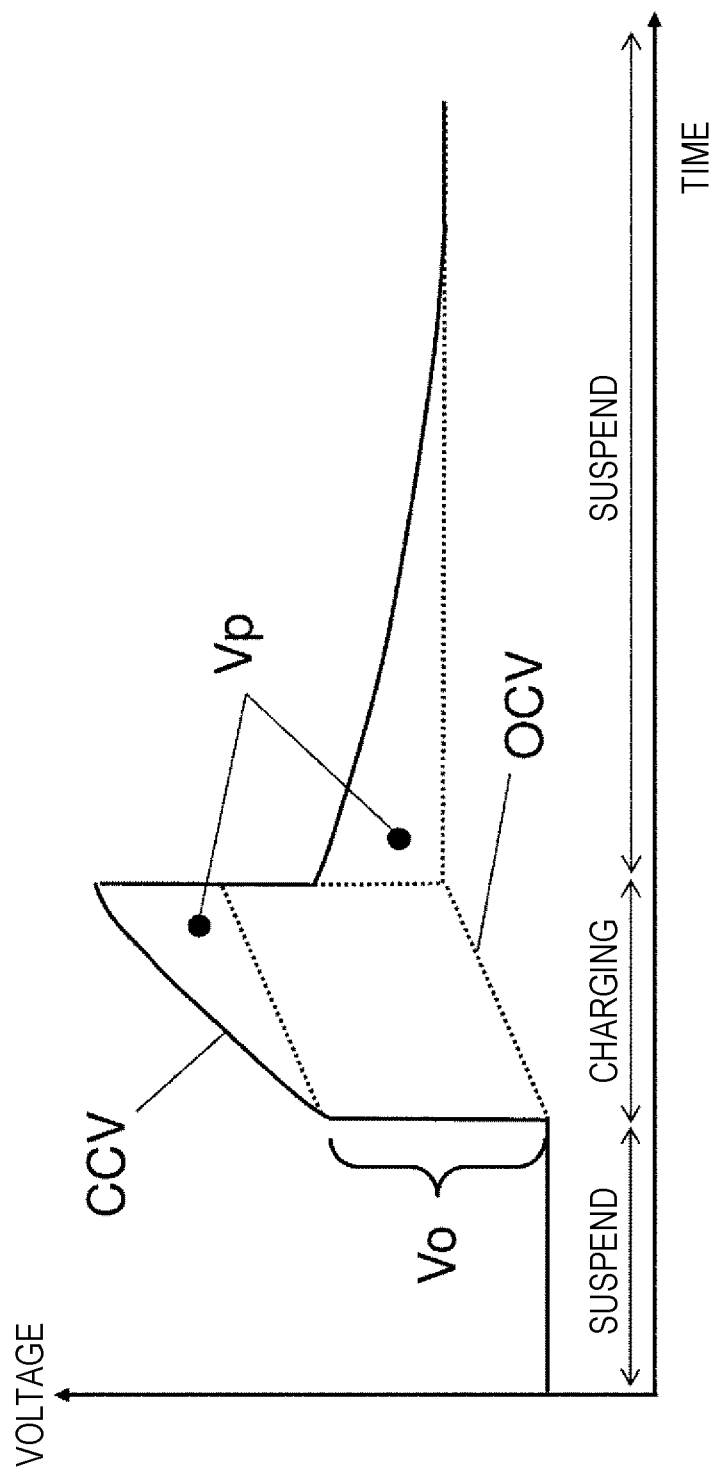
FIG. 8 is a diagram illustrating a behavior of a voltage in a case where a charging current flows in the unit cell represented by the equivalent circuit of FIG. 7.

FIG. 8 illustrates a behavior of the voltage in a case where the charging current I flows in the unit cell 111 indicated by the equivalent circuit of FIG. 7. As illustrated in FIG. 8, when the charging current I flows, a voltage rise Vo (=I×Ro) occurs with respect to the OCV by Ro, and then a polarization voltage Vp (=Ip×Rp) occurs slowly which is a voltage rise caused by Rp. The OCV is represented by the following Expression (4) from the equivalent circuit illustrated in FIG. 7.

$$Vo = I \times Ro \quad (2)$$

$$Vp = Ip \times Rp \quad (3)$$

$$OCV = CCV - (Vo + Vp) \quad (4)$$

Further, Ro and Rp in Expressions (2) and (3) are values obtained by multiplying a rising rate (%) of the internal resistance to the resistance values (RoInit, RpInit) when the unit cell 111 is released as the following Expression (5) and (6). Regarding "RoInit" and "RpInit", the data table of RoInit and RpInit according to the SOC and the temperature is stored in the memory unit 180 in advance, and "RoInit" and "RpInit" are calculated from the data table on the basis of the SOC and the temperature at the present moment. In addition, "Ip" may be obtained using a result obtained by applying a primary delay filter on a current value as the following Expression (7). In Expression (7), "I" represents a current value, "ts" represents a sampling cycle, "T" is a time constant, and "Ipold" represents "Ip" before one control cycle.

$$Ro = RoInit \times SOH / 100 \quad (5)$$

$$Rp = RpInit \times SOH / 100 \quad (6)$$

$$Ip = I \times (ts/\tau) + Ipold \times (1 - ts/\tau) \quad (7)$$

The SOCv computation unit 1512 computes the OCV by Expression (4), and computes the SOC corresponding to the OCV as the SOCv as illustrated in FIG. 6. In a case where the correlation of FIG. 6 is expressed as SOC=Map(OCV), the SOCv is obtained by applying the OCV calculated by Expression (4) to Map(OCV).

The combination computation unit 1513 computes the SOC by the following Expression (8) using the SOCi computed by the SOCi computation unit 1511, the SOCv computed by the SOCv computation unit 1512, the current, and the temperature as inputs. In Expression (8), "w" represents a weight coefficient and, for example, is calculated by the following Expression (9).

$$SOC = w \times SOCv + (1-w) \times SOCi \quad (8)$$

$$w = 1 / (1 + |I| \times Ro) \quad (9)$$

As the above Expressions (8) and (9), when the current I is large, the weight coefficient w becomes small. Therefore, an eccentricity to the SOCi is increased. On the contrary, when the current I is small, the weight coefficient w becomes large. Therefore, the eccentricity to the SOCv is increased. In this embodiment, in order to avoid an influence of an SOCv error accompanied by a resistance error when the current flows, the weight coefficient w as Expression (9) is installed, but the invention is not limited thereto.

Figure 9:
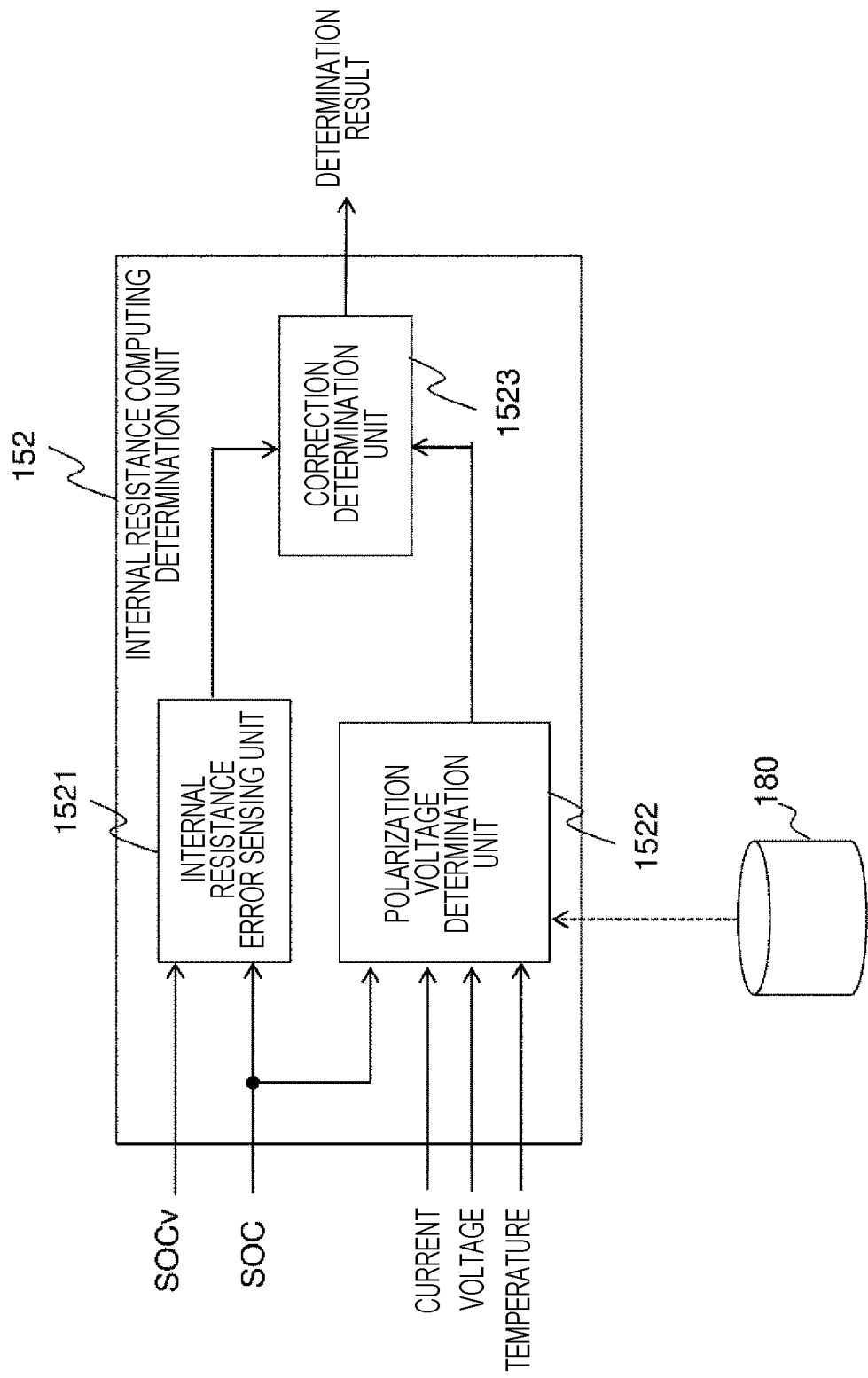
FIG. 9 is a block diagram illustrating a configuration of an internal resistance computing determination unit.

FIG. 9 is a block diagram illustrating a configuration of the internal resistance computing determination unit 152. The internal resistance computing determination unit 152 includes an internal resistance error sensing unit 1521, a polarization voltage determination unit 1522, and a correction determination unit 1523.

The internal resistance error sensing unit 1521 determines whether there is an error in the resistance values (Ro, Rp) in the SOCv computation on the basis of the SOC and the SOCv input from the SOC computation unit 151. Specifically, in a case where an absolute value of a difference between the SOC and the SOCv is equal to or more than a predetermined value, it is determined that there is a need to correct an internal resistance value (each circuit parameter in the equivalent circuit of FIG. 7) used in the SOCv computation, and the determination result is output.

Figure 10:
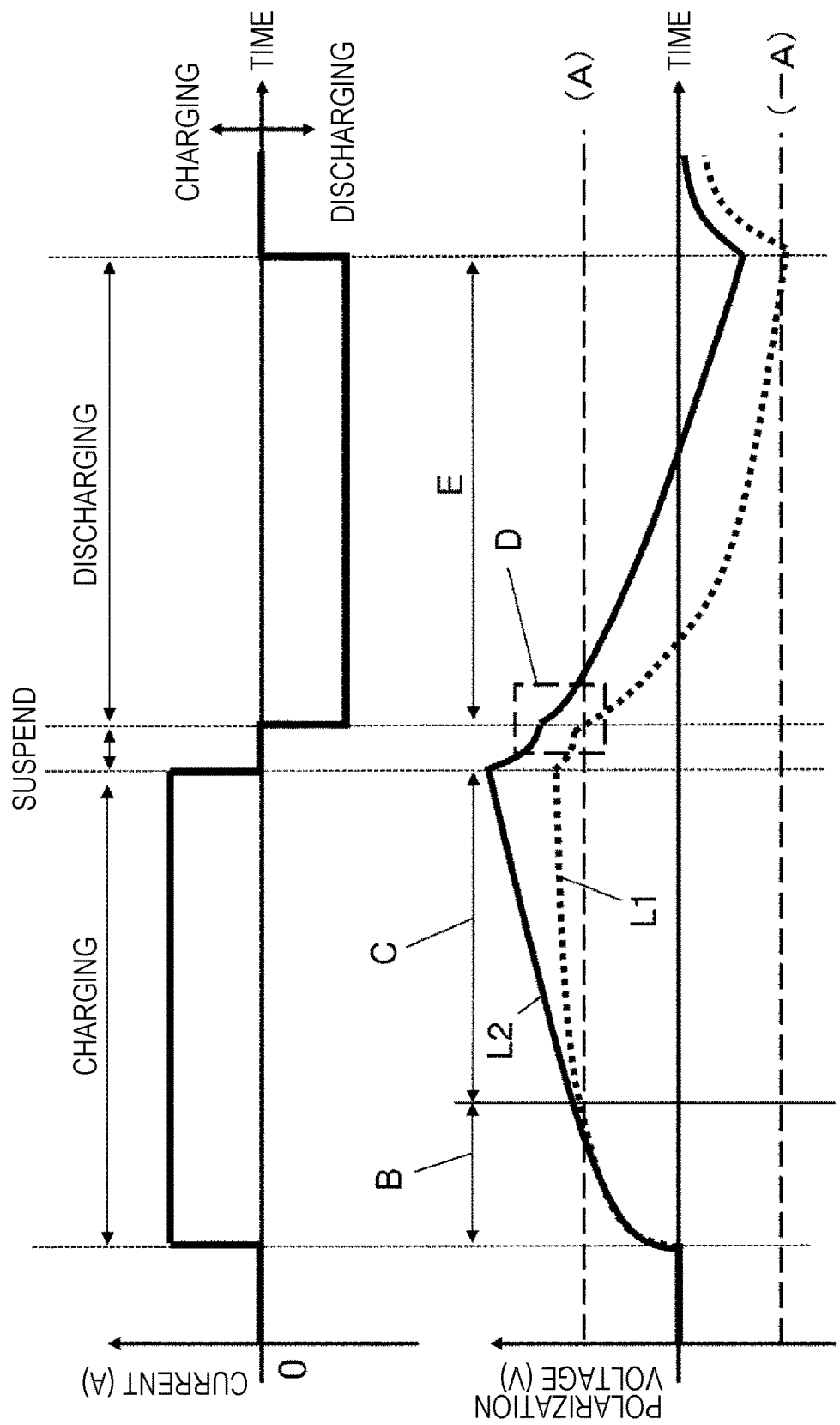
FIG. 10 is a diagram for describing whether the internal resistance computation is possible.

The polarization voltage determination unit 1522 calculates the polarization voltage Vp on the basis of the SOC, the current, the voltage, and the temperature, and determines whether the internal resistance computation is possible on the basis of a magnitude of the calculated polarization voltage Vp. FIG. 10 is a diagram for describing that the polarization voltage determination unit 1522 determines whether the internal resistance computation is possible. A broken line L1 indicates the calculated value of the polarization voltage, and a solid line L2 indicates a true value of the polarization voltage. During a period when the charging current flows first, the polarization voltage Vp is gradually increased as time goes by. At this time, the sign of the polarization voltage Vp is a positive sign. Even though there is a charging/discharging suspend state after the charging current is input, the polarization is relaxed in the suspend state. However, when a discharging current flows before the relaxation is completed, the polarization voltage is gradually increased again in a negative direction as time goes by.

When viewing the portion of the charging state of FIG. 10, in an initial region B in an energization time, a gap between the calculated value and the true value of the polarization voltage is small. However, the polarization voltage is increased as the energization time is lengthened. In addition, it can be seen that the gap between the calculation value and the true value of the polarization voltage is also increased (region C). Further, in order to shorten the suspending after the charging, the discharging current is set to flow before the polarization voltage is relaxed. As a result, an influence of an error (calculation error) caused when the charging current flows is left when the discharging current flows (region D). Therefore, it can be seen that the polarization voltage is not calculated accurately when the discharging current flows (region E). In a region of a long energization time, as one cause of degrading the calculation accuracy of the polarization voltage, another resistance component caused by dispersion of lithium ions besides the resistance components accompanied by the electrochemical reaction of the battery.

In the region C illustrated in FIG. 10 where the polarization voltage is large and the polarization voltage can be accurately calculated, an error in the calculated internal resistance is large, and an error even in the SOH computation based on the internal resistance also occurs. In addition, in a discharging period (region E), the polarization voltage caused during the discharging is left before the discharging starts. Since the polarization voltage is still large, it can be determined that the calculation accuracy of the polarization voltage during a period when the discharging current flows is not possible to be sufficiently secured.

Then, in this embodiment, as illustrated in FIG. 10, a predetermined threshold (A on a positive side, −A on a negative side) is installed in the polarization voltage, and the internal resistance is not computed on a condition that an absolute value of the polarization voltage is large. Further, in a case where the absolute value of the polarization voltage before the current flows is equal to or more than the threshold, the internal resistance is not computed during a period when the current flows.

The threshold of the polarization determination (hereinafter, referred to as a polarization determining threshold) may be set such that the current is made flow in consideration of an actual running pattern of a vehicle and the battery characteristics, and the polarization voltage generated at that time is estimated. In addition, regarding the polarization voltage as an index used in the determination of the polarization voltage determination unit 1522, the polarization voltage Vp which is voltage change caused by the polarization resistance component may be calculated from Expression (3), or may be calculated by the following Expression (10).

$$Vp = CCV - V_o - OCV \tag{10}$$

Further, when the polarization voltage is determined, the absolute value of the polarization voltage obtained by Expressions (3) and (10) is calculated, and is set as an index. In other words, it is determined whether the absolute value |Vp| of the polarization voltage Vp is equal to or more than "A". In addition, the absolute value of the polarization voltage is not calculated, but the calculated polarization voltage Vp is used without change. It may be determined whether the polarization voltage Vp satisfies with Vp≥A and Vp≤−A respect to the polarization determining threshold A.

The correction determination unit 1523 determines whether a correction computation of the internal resistance is performed on the basis of the determination results of the internal resistance error sensing unit 1521 and the polarization voltage determination unit 1522. As described above, the internal resistance error sensing unit 1521 determines whether there is a need to correct the internal resistance value in a case where the absolute value of the difference between the SOC and the SOCv is equal to or more than the predetermined value. In addition, the polarization voltage determination unit 1522 determines whether the absolute value of the polarization voltage is equal to or more than the polarization determining threshold. The correction determination unit 1523 determines that the correction computation of the internal resistance is performed in a case where it is determined that the correction of the internal resistance value is necessary in the internal resistance error sensing unit 1521, and the absolute value of the polarization voltage is less than the polarization determining threshold. In other cases, it is determined that the correction computation of the internal resistance is not possible to be performed.

Figure 11:
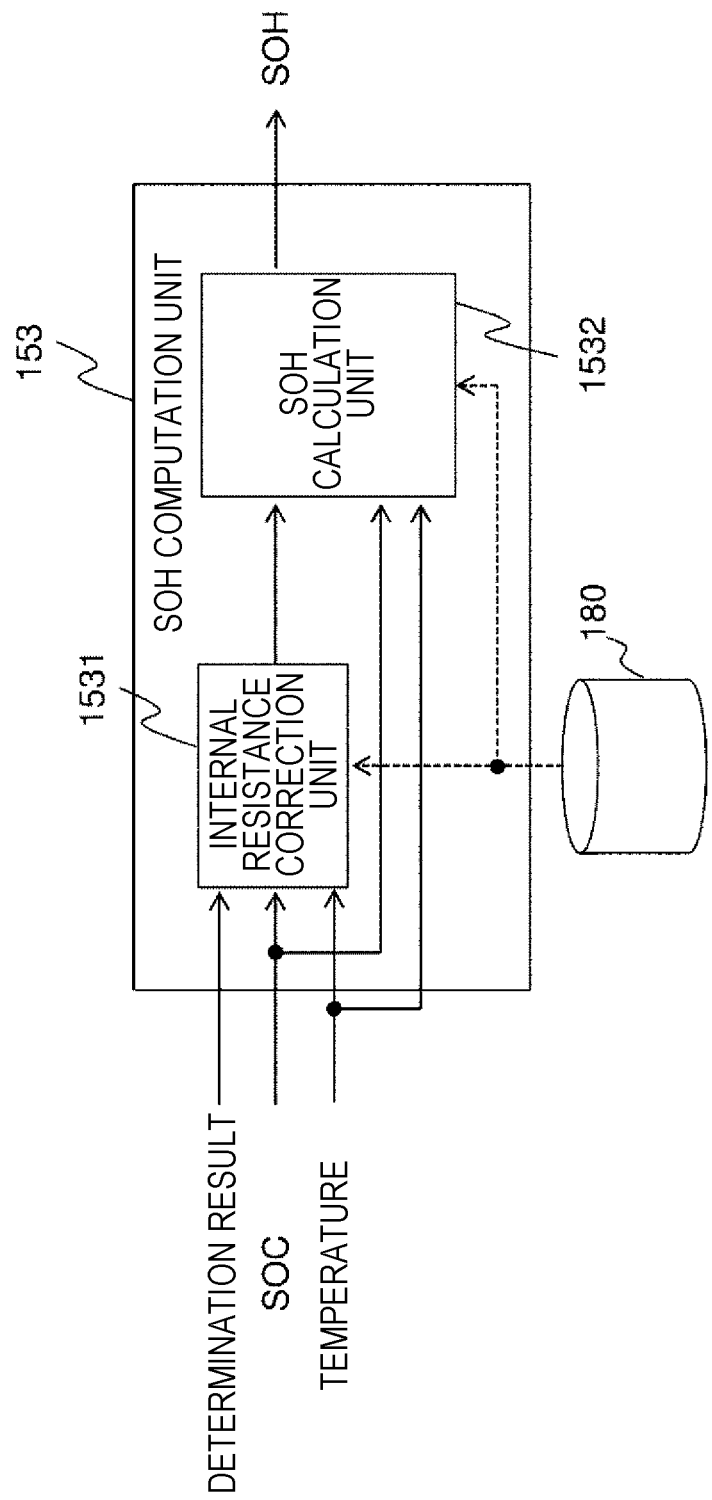
FIG. 11 is a block diagram illustrating a configuration of an SOH computation unit.

FIG. 11 is a block diagram illustrating a configuration of the SOH computation unit 153. The SOH computation unit 153 includes an internal resistance correction unit 1531 and an SOH calculation unit 1532. The internal resistance correction unit 1531 receives a determination result of the internal resistance computing determination unit 152, the SOC, and the temperature. In a case where it is determined that the internal resistance computation is not possible to be performed by the internal resistance computing determination unit 152, the internal resistance correction unit 1531 reads out the internal resistance value corresponding to the input SOC and the input temperature from an internal resistance table stored in the memory unit 180 to correct the internal resistance value. The corrected result is output to the SOH calculation unit 1532.

As a correction method of the internal resistance value, the following method is performed on the basis of a difference between the SOC and the SOCv for example. In a case where a different (SOC−SOCv) is positive during the charging, the internal resistance value is corrected to be reduced by a predetermined correction amount to reduce the difference. On the contrary, in a case where the difference (SOC−SOCv) is negative during the charging, the internal resistance value is corrected to be increased by a predetermined correction amount. In addition, in a case where the difference (SOC−SOCv) is positive during the discharging, the internal resistance value is corrected to be increased by a predetermined correction amount. On the contrary, in a case where the difference is negative, the internal resistance value is corrected to be reduced by a predetermined correction amount.

The SOH calculation unit 1532 calculates the SOH by the following Expression (11) for example on the basis of an internal resistance value Ro after correction and an initial internal resistance value RoInit corresponding to the SOC and the temperature. Further, in the example shown in Expression (11), the SOH is set to a ratio of Ro and RoInit, and may be a ratio of Rp and RpInit.

$$SOH = 100 \times Ro/RoInit \tag{11}$$

On the other hand, in a case where the correction determination unit 1523 determines that the correction computation of the internal resistance is not possible, the internal resistance correction unit 1531 does not correct the internal resistance value, but outputs the previous internal resistance value at which the polarization voltage is determined as large. For example, in a case where the computation is performed over an arbitrary computation period, the internal resistance value calculated in a computation period just before the computation period when the correction computation is determined not possible is output. Therefore, also in the case of the SOH calculated by Expression (11), the previous SOH at which the polarization voltage is determined as large is output.

In addition, the SOH calculated by the SOH calculation unit 1532 is fed back to the SOCv computation unit 1512 in the SOC computation unit 151, and used in the computation of the SOCv in the next computation period. As a result, the correction of the internal resistance value is sequentially performed to reduce the difference between the SOC and the SOCv.

FIG. 12 is a diagram illustrating an example of an SOH computation result. FIG. 12(a) illustrates time-sequential data of current (line LI) and voltage (line LV). FIGS. 12(b) and 12(c) illustrate the polarization voltage and a computation result of the SOH in a case where the current and the voltage illustrated in FIG. 12(a) are input. Further, since the current is needed to flow in order to perform the correction computation of the internal resistance value, the resistance correction computation is not performed in a suspend period when the current does not flow. In this case, the SOH calculation unit 1532 outputs the SOH computation result immediately before the suspend period.

First, the polarization voltage falls within a range of the polarization determining threshold (−A to A) in a previous period H1a of a discharging period H1. Therefore, the correction computation of the internal resistance value is performed, and the SOH is gradually increased. In a later period H1b of the discharging period H1, the polarization voltage is deviated from the polarization determining threshold (−A) (the case of $|Vp| \geq A$ is considered as being deviated). The correction computation of the internal resistance value is suspended at a deviated timing, and the internal resistance value before deviating from the polarization determining threshold is output. As a result, the SOH calculated on the basis of the internal resistance value is not updated during a period when the polarization voltage is deviated from the polarization determining threshold. The SOH of the same value as the SOH before deviating from the polarization determining threshold is output.

After the suspending of the discharging period H1, the suspend period comes. However, since the suspend period is short, a large portion of the polarization voltage before current switching is left even at a time point P1 (before the discharging current flows) when the current is switched from the suspend period to a charging period J1. Therefore, the SOH update is stopped even when the charging current flows in the charging period J1, and the SOH (the SOH at a time point when the discharging period H1 ends) before the polarization determination is output.

In the case of the next discharging period H2, the previous suspend period is long. At a time when the discharging period H2 starts, the polarization voltage is relaxed within the range of the polarization determining threshold. Therefore, when the discharging starts in the discharging period H2, the SOH update is performed. However, in a later period H2b of the discharging period H2, the polarization voltage is deviated from the polarization determining threshold (−A). Therefore, the SOH is not updated.

Next, in the case of a charging period J2, the polarization voltage at a time point P2 (before the charging current flows) immediately before the charging period J2 is deviated from the polarization determining threshold. Therefore, similarly to the case of the charging period J1, the SOH is not updated, and the SOH of the same value as the SOH immediately before the charging period J2 is output.

As described above, the assembled battery control unit 150 as the battery control device includes the internal resistance correction unit 1531 which calculates the internal resistance value of the assembled battery 110, and controls the assembled battery 110 on the basis of the internal resistance value which is calculated by the internal resistance correction unit 1531. The polarization voltage determination unit 1522 of the assembled battery control unit 150 calculates an index indicating the polarization voltage of the assembled battery 110, and determines whether the calculated index is equal to or more than a predetermined threshold. For example, in this embodiment, as an index indicating the polarization voltage, the polarization voltage Vp calculated on the basis of Expression (3) or Expression (10) is used. In this case, the polarization voltage Vp is calculated on the basis of at least one of the current flowing to the battery, the voltage, and the temperature.

Then, if the polarization voltage Vp as an index is determined as $|Vp| \geq A$ with respect to the polarization determining threshold A, the assembled battery 110 is controlled on the basis of the internal resistance value which is calculated when $|Vp| < A$ before the determination is satisfied. In this way, in a situation that a computation error of the internal resistance value is large, it is possible to suppress a reduction in computation accuracy of the internal resistance and the state of health (SOH) of the internal resistance of the battery by using the internal resistance value calculated when $|Vp| < A$.

In this way, in this embodiment, in a case where the polarization voltage determined on the basis of one or more factors (that is, the polarization voltage Vp as a voltage variation by the polarization resistance component calculated by Expressions (3) and (10)) is determined as $|Vp| \geq A$ (polarization determining threshold), an error of the calculated value of the internal resistance is large. Therefore, the correction computation of the internal resistance based on the difference between the SOC and the SOCv is not performed. In that case, it is possible to suppress a reduction in computation accuracy of the internal resistance of the battery and the state of health (SOH) of the internal resistance by using the internal resistance value calculated when $|Vp| < A$ before the determination is satisfied.

In addition, as illustrated by symbol P1 of FIG. 12, if it is determined that the polarization voltage Vp is equal to or more than a determination threshold ($|Vp| \geq A$) at the time of non-energizing (suspend period) before the energizing starts, the battery of the charging period is controlled in the charging period J1 after the energizing starts on the basis of the internal resistance value calculated when the polarization voltage is less than the determination threshold ($|Vp| < A$) before the determination. As a result, even in a case where there is a need to be energized before the polarization voltage is relaxed, it is possible to suppress a reduction in computation accuracy of the internal resistance of the battery and the state of health (SOH) of the internal resistance.

Further, the internal resistance value is calculated on the basis of a difference between two charging states which are different in the calculation method (for example, the difference between the SOC and the SOCv). The internal resistance value is corrected to make the difference between the SOC and the SOCv small. As a result, as illustrated in FIG. 12(c), in the case of $|Vp| \geq A$ (that is, in a situation that the computation error becomes large), the calculation value of the state of health SOH of the battery is kept constant. Therefore, it is possible to prevent that the state of health SOH is deviated from a true value. In this case, one of two charging states (SOC and SOCv) is the charging state SOCv which is calculated on the basis of the open circuit voltage OCV of the battery.

Second Embodiment

A second embodiment of the invention will be described with reference to FIGS. 13 to 16. Further, the configuration of the electric motor system of the hybrid electric vehicle in this embodiment is similar to that illustrated in FIG. 1 of the first embodiment. In the following, the description will be given focusing on different portions from the configuration of the first embodiment.

In the first embodiment, Vp is directly calculated from Expression (3) or Expression (10), and used as an index to determine whether the polarization voltage is equal to or more than the predetermined value. On the other hand, in this embodiment, instead of the directly calculated Vp, a current value flowing to the battery is used as the index to determine whether the polarization voltage is equal to or more than the predetermined value.

FIG. 13 is a block diagram of the internal resistance computing determination unit 152 in this embodiment. Only the configuration of a polarization voltage determination unit 1522a is different from the internal resistance computing determination unit 152 illustrated FIG. 9. While the polarization voltage is calculated from Expression (3) or Expression (10) in the polarization voltage determination unit 1522 of FIG. 9, in the polarization voltage determination unit 1522a of this embodiment, a current value is input to calculate a moving average value of the current in an arbitrary section, and the moving average value of the current is used as a determination index of the polarization voltage.

The polarization voltage may be changed variously according to a history of the current flowing to the battery. Therefore, the magnitude of the polarization voltage can be indirectly determined by using the moving average value calculated from the current in a certain section.

FIG. 14 is a diagram illustrating an example of a moving average value calculation. In FIG. 14, line L30 represents an instantaneous current, and line L31 represents a moving average current. The moving average value of an arbitrary time window Tw is calculated according to the following Expression (12), and is compared with the polarization determining threshold. Similarly to the case of the first embodiment, the polarization determining threshold may be determined on the basis of an actual running pattern and an actual battery characteristic of a vehicle in which the electric motor system is mounted.

[MATH. 1]

$$Iave = \sum_{i=x-Tw}^{x} Ii/Tw \qquad (12)$$

In addition, while the moving average value has been exemplified in FIG. 14, Iave obtained as a result of the primary delay filter on the current value may be used instead of the moving average value as illustrated in the following Expression (13). Here, "I" represents a current value, "ts" represents a sampling cycle, "T" represents a time constant, and "Iave_old" represents Iave before one control cycle.

Further, Tw and T of Expressions (12) and (13) may vary according to the temperature of the battery.

[MATH. 2]

$$Iave = I \times (ts/\tau) + Iave_{old} \times (1 - ts/\tau) \qquad (13)$$

FIG. 15 is a diagram illustrating a relaxation behavior of the polarization voltage in accordance with the temperature. FIG. 15(b) illustrates a transition of the current flowing to the battery, and FIG. 15(a) illustrates a transition of a battery voltage (CCV). Line L41 indicates the case of low temperature, and a polarization relaxation time is t41. Line L42 indicates the case of room temperature, and the polarization relaxation time is t42. Line L43 indicates the case of high temperature, and the polarization relaxation time is t43. It can be seen that the polarization is relaxed and it takes a long time as the battery temperature is low. Tw and r are set to values which become large as the temperature is low, and set to values which become small as the temperature is high. Therefore, a moving average value reflecting the relaxation behavior of the polarization voltage, or the current value through the primary delay filter can be calculated, and the behavior of the polarization voltage can be expressed with more accuracy.

FIG. 16 is a diagram illustrating an example of an SOH computation result in the second embodiment. FIG. 16(a) illustrates time-sequential data of the current (line LI) and the voltage (line LV). FIGS. 16(b) and 16(c) illustrate the moving average current and a computation result of the SOH in a case where the current and the voltage illustrated in FIG. 16(a) are input. Similarly to the case of the first embodiment, the resistance correction computation is not performed in the suspend period where no current flows. The SOH computation result in this case is output immediately before the suspend period starts.

First, the moving average current falls within a range of the polarization determining threshold (−A1 to A1) in the previous period H1a of the discharging period H1. Therefore, the correction computation of the internal resistance value is performed, and the SOH is gradually increased. In the later period H1b of the discharging period H1, the moving average current is deviated from the polarization determining threshold (−A1). The correction computation of the internal resistance value is suspended at a deviated timing, and the internal resistance value before deviating from the polarization determining threshold is output. As a result, the SOH calculated on the basis of the internal resistance value is not updated during a period when the moving average current is deviated from the polarization determining threshold. The SOH of the same value as the SOH before deviating from the polarization determining threshold is output.

After the suspending of the discharging period H1, the suspend period comes. However, since the suspend period is short, the moving average current is deviated from the polarization determining threshold even at a time point P3 (before the discharging current flows) when the current is switched to from the suspend period to a charging period J1. Therefore, the SOH update is stopped even when the charging current flows in the charging period J1, and the SOH (the SOH at a time point when the discharging period H1 ends) before the polarization determination is output.

In the case of the next discharging period H2, the previous suspend period is long. At a time when the discharging period H2 starts, the moving average current is relaxed within the range of the polarization determining threshold. Therefore, when the discharging starts in the discharging period H2, the SOH updates is performed. However, in a later period H2b of the discharging period H2, the moving average current is deviated from the polarization determining threshold (−A1). Therefore, the SOH is not updated, but the SOH immediately before the starting of the later period H2b is output.

Next, in the case of a charging period J2, the moving average current at a time point P4 (before the charging current flows) immediately before the charging period J2 is deviated from the polarization determining threshold. Therefore, similarly to the case of the charging period J1, the SOH is not updated, and the SOH of the same value as the SOH immediately before the charging period J2 is output.

In this embodiment, instead of the polarization voltage Vp calculated by Expressions (3) and (10) in the first embodiment, a value obtained by time-sequentially averaging the current flowing to the battery is calculated as an index indicating the polarization voltage of the battery. Then, on the basis of whether the index is equal to or more than the polarization determining threshold (whether the index is deviated from the polarization determining threshold), it is determined whether the polarization voltage is equal to or more than the predetermined value. In a case where it is determined that the polarization voltage is equal to or more than the predetermined value, the correction computation of the internal resistance is not performed. The control is performed using the internal resistance computation value before the polarization voltage is equal to or more than the predetermined value. In this way, in a situation that an error of the correction computation of the internal resistance becomes large, the correction computation of the internal resistance is not performed. Therefore, it is possible to suppress a reduction of calculation accuracy of the internal resistance and the state of health (SOH) of the internal resistance. In addition, it is possible to easily achieve the effect in a case where the average value of the current value is obtained compared to a case where the polarization voltage Vp is calculated.

Third Embodiment

A third embodiment of the invention will be described with reference to FIGS. 17 and 18. Further, the configuration of the electric motor system of the hybrid electric vehicle in this embodiment is similar to that illustrated in FIG. 1 of the first embodiment. The description below will be given focusing on portions different from those of the first and second embodiments.

In the first embodiment, Vp is directly calculated as an index from Expression (3) or Expression (10). It is determined whether the polarization voltage is equal to or more than the polarization determining threshold using the index. In addition, in the second embodiment, instead of the directly calculated Vp, it is determined whether the polarization voltage is equal to or more than the polarization determining threshold on the basis of the current value flowing to the battery. On the other hand, in this embodiment, it is possible to determine whether the polarization voltage is equal to or more than the predetermined value with a method simpler that those of the first and second embodiment.

The polarization voltage becomes large as the energizing time of the current goes by. Therefore, in this embodiment, the energizing time of the current is counted. It is determined that the polarization voltage is equal to or more than the predetermined value on the basis of whether the counted continuous energizing time is equal to or more than a predetermined value.

Figure 17:
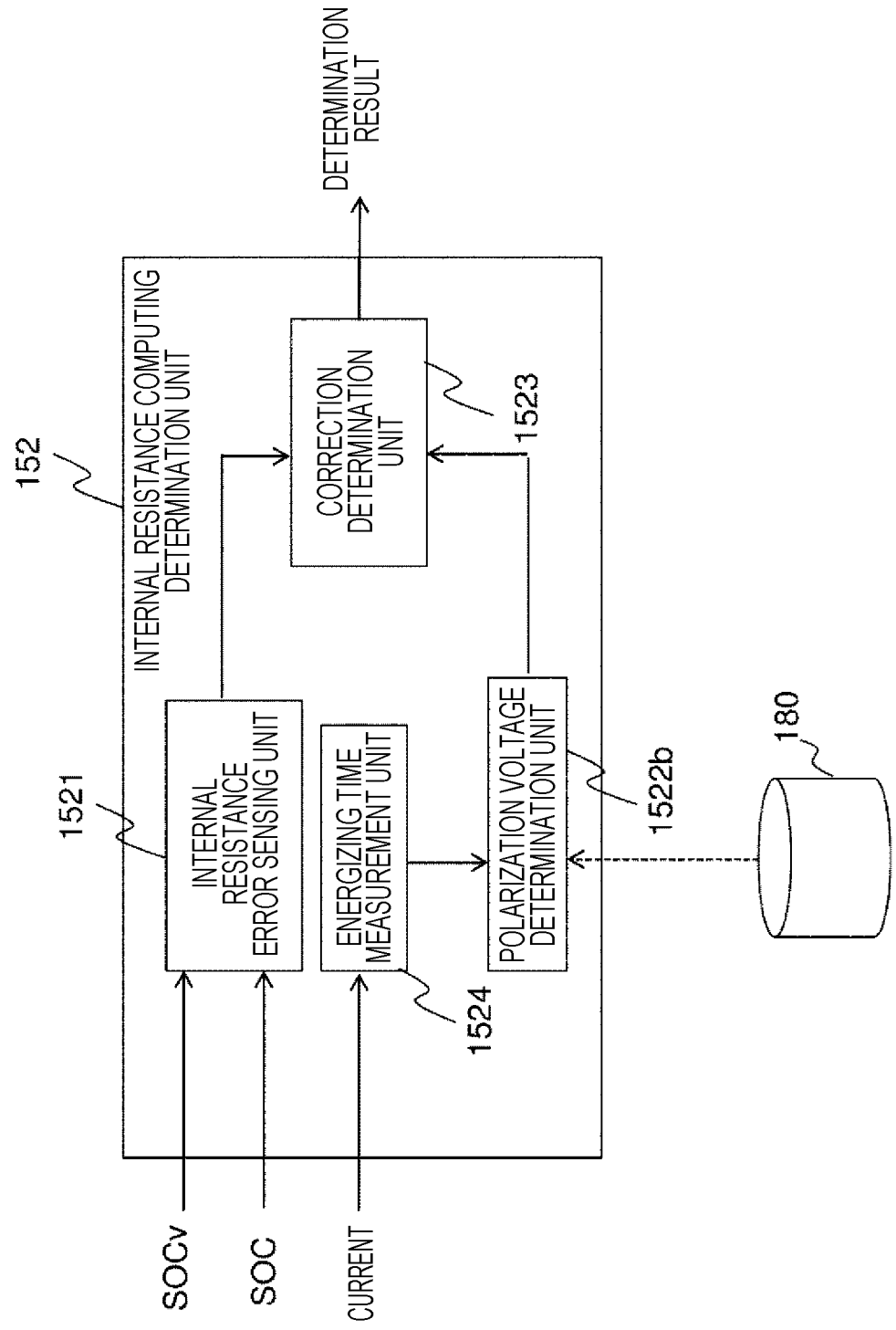
FIG. 17 is a block diagram illustrating a configuration of the internal resistance computing determination unit in the second embodiment.

FIG. 17 is a block diagram of the internal resistance computing determination unit 152 in this embodiment. A difference from the internal resistance computing determination unit 152 in the first and second embodiments is that there is provided with an energizing time measurement unit 1524. The energizing time measurement unit 1524 receives the current, and counts a continuous energizing time when an absolute value of the current is equal to or more than the predetermined value and only one of the charging current and the discharging current continuously flows. The count result is input to a polarization voltage determination unit 1522b.

In a case where the count result (continuous energizing time) is equal to or more than the polarization determining threshold A2, the polarization voltage determination unit 1522b determines that the polarization voltage is large. In a case where it is determined that the polarization voltage is large, the internal resistance value before that the polarization voltage is determined to be large is output as the internal resistance value of the battery similarly to the case of the first and second embodiment.

FIG. 18 is a diagram illustrating an example of an SOH computation result in the third embodiment. FIG. 18(a) illustrates time-sequential data of the current (line LI) and the voltage (line LV). FIGS. 18(b) and 18(c) illustrate the count result (continuous energizing time) and a computation result of the SOH in a case where the current and the voltage illustrated in FIG. 18(a) are input. Similarly to the case of the first embodiment, the resistance correction computation is not performed in the suspend period where no current flows. The SOH computation result in this case is output immediately before the suspend period starts.

First, the continuous energizing time is less than the polarization determining threshold (A2) in the previous period H1a of the discharging period H1. Therefore, the correction computation of the internal resistance value is performed, and the SOH is gradually increased. In the later period H1b of the discharging period H1, the continuous energizing time becomes equal to or more than the polarization determining threshold (A2) and deviated. The correction computation of the internal resistance value is suspended at a deviated timing, and the internal resistance value before deviating from the polarization determining threshold is output. As a result, the SOH calculated on the basis of the internal resistance value is not updated during a period when the continuous energizing time is deviated from the polarization determining threshold. The SOH of the same value as the SOH before deviating from the polarization determining threshold is output.

Thereafter, the suspend period (the absolute value of the current is equal to or less than the predetermined value) comes. The count value of the energizing time is reset to "0". If the suspend period ends and the charging period J1 comes, the charging current starts to flow, and the energizing time is counted again. Then, if the continuous energizing time becomes equal to or more than the polarization determining threshold (A2) in a later period J1b of the charging period J1, the correction computation of the internal resistance value is suspended, and the SOH immediately before the correction computation is suspended is output. The discharging period H2 and the charging period J2 also show the similar behavior.

As described above, even in this embodiment, in a situation that the computation error of the internal resistance is large, the correction computation of the internal resistance is not performed, and the calculation value of the internal resistance before the continuous energizing time becomes equal to or more than the polarization determining threshold (A2) is used. Therefore similarly to the case of the first and second embodiments, it is possible to suppress a reduction of the computation accuracy of the internal resistance and the state of the health (SOH) of the internal resistance. Further, in this embodiment, a time (continuous energizing time) when the current flowing to the battery is energized is counted, and it is determined whether the polarization voltage is equal to or more than the polarization determining threshold on the basis of the counted continuous energizing time. Therefore, compared to the case of the first and second embodiments, it is possible to appropriately determine whether the polarization voltage is equal to or more than the polarization determining threshold with a simpler process.

Fourth Embodiment

A fourth embodiment of the invention will be described with reference to FIGS. 19 to 21. Further, the configuration of the electric motor system of the hybrid electric vehicle in this embodiment is similar to that illustrated in FIG. 1 of the first embodiment. The description below will be given focusing on portions different from those of the first to third embodiments.

In the first to third embodiments, one parameter is used as an index for determining the polarization voltage. For example, in the first embodiment, it has been determined whether the polarization voltage is equal to or more than the predetermined value only using Vp calculated from Expression (3) or Expression (10) as the index. On the other hand, in this embodiment, the magnitude of the polarization voltage is not determined from one parameter. However, for example, the magnitude of the polarization voltage is determined by the polarization voltage calculated from Expression (3) or Expression (10) in the first embodiment in parallel with the determination of the energizing time in the third embodiment.

Further, in the following, the description will be given about an example in which the method of using the polarization voltage calculated by Expression (10) of the first embodiment as the index is used in parallel with the method of the third embodiment, but a combination of paralleling methods is not limited thereto.

In a case where the polarization voltage is calculated by subtracting Vo and OCV from the battery voltage (CCV) as Expression (10), the components of the polarization voltage which is difficult for modeling can be directly extracted without using an equivalent model. However, there is a problem that the computation errors of Vo and OCV are included. In particular, in a case where an error is included in Ro used in the computation of Vo, that is, a case where there is a gap between the internal resistance value recognized by the assembled battery control unit 150 and the internal resistance value of the battery (actual control target), an error is generated in Vp calculated from Expression (10). Therefore, there is a possibility that the determination on whether the polarization voltage is large is not performed with accuracy.

FIG. 19 is a diagram illustrating an example in a case where such a determination is not performed with accuracy. FIG. 19 is a diagram illustrating the polarization voltage calculation value and a polarization voltage true value at the time of energizing (charging/discharging). There occurs a gap between the polarization voltage calculation value (line L51) and the polarization voltage true value (line L52) by an error included in the internal resistance value. At the time of discharging, the polarization voltage calculation value is shifted to the positive side with respect to the polarization voltage true value. At the time of charging, the polarization voltage calculation value is shifted to the negative side with respect to the polarization voltage true value.

Therefore, in the later period H1b of the discharging period, even though the polarization voltage true value is less than the polarization determining threshold (−A) and deviated from a range of the threshold, the polarization voltage calculation value falls within the range of the polarization determining threshold. Even in the later period Jib of the charging period, the similar situation occurs. As a result, even though the correction computation of the internal resistance is not possible, it is erroneously determined that the correction computation is possible because that the calculated value of the polarization falls within the threshold. In other words, it can be seen that the determination of the polarization voltage using Expression (10) is not desirable during the energizing.

In addition, in the first embodiment, in a case where the polarization voltage calculation value before the energizing starts is deviated from the polarization determining threshold as illustrated by symbol P1 of FIG. 12, the computation of the internal resistance is not performed. However, at the time when the energizing starts, if the polarization determination is performed on the basis of the polarization voltage at the moment when the current flows, the polarization voltage calculation value is deviated from the polarization determining threshold because of the error of the internal resistance. However, regarding this problem, the determination is performed using the polarization voltage before the current flows (for example, before one control cycle) instead of using the polarization voltage at the time when the energizing starts. Therefore, since the current does not flow, Vo in Expression (10) becomes "0", and thus the polarization voltage can be correctly extracted. As a result, the polarization can be determined correctly.

On the other hand, in a method of counting the energizing time described in the third embodiment, the polarization voltage can be determined without being affected by an error such as the current, the voltage, and the internal resistance value. Therefore, in the method of the first embodiment, the polarization determination during the energizing can be performed with accuracy even in such a situation that the gap described above occurs. However, since the count result is cleared to zero after the current flows, it is not possible to determine whether the polarization voltage is relaxed during the suspend period when the current does not flow, and it is not possible to determine whether the polarization voltage before the current flows is large.

Therefore, in the determination of the polarization voltage at the moment of the energizing of this embodiment, a process of determining whether an absolute value of the current at the time of determining the polarization voltage is equal to or less than a predetermined value is added to the method of the first embodiment. In other words, it is determined that whether the absolute value of the current before the current flows is equal to or less than the predetermined value and the polarization voltage before the current flows falls within the polarization determining threshold (referred to as a first polarization determination). On the other hand, the method (referred to as a second polarization determination) of the third embodiment is applied to the determination of the polarization voltage during the energizing.

FIG. 20 is a block diagram illustrating a configuration of the internal resistance computing determination unit 152 in this embodiment. The internal resistance computing determination unit 152 of FIG. 20 is configured to further include the energizing time measurement unit 1524 described in the third embodiment to the internal resistance computing determination unit 152 (FIG. 9) in the first embodiment. The count result (continuous energizing time) output by the energizing time measurement unit 1524 is input to a polarization voltage determination unit 1522c. The polarization voltage determination unit 1522c outputs a determination result indicating that the computation is not possible in a case where the internal resistance is determined as not computable from any one of the determination result (first polarization determination) by the current and Vp calculated by Expression (10) before the current flow and the determination result (second polarization determination) by the count result of the energizing time.

FIG. 21 is a diagram illustrating an example of an SOH computation result in the fourth embodiment. FIG. 21(a) illustrates time-sequential data of the current (line LI) and the voltage (line LV). FIGS. 21 (b) to 21 (d) illustrate results of the polarization voltage, the continuous energizing time, and the computation result of the SOH in a case where the current and the voltage illustrated in FIG. 21(a) are input. The current necessarily flows in order to perform the correction computation of the internal resistance value. Therefore, in the suspend period when the current does not flow, the resistance correction computation is not performed. However, as the SSOH computation result in this case, the SOH computation result immediately before the suspending is output.

In the previous period H1a of the discharging period H1, the correction computation is determined as not possible in any of the determination result (first polarization determination) by the current and Vp calculated by Expression (10) before the current flows, and the determination result (second polarization determination) by the count result of the energizing time. Therefore, the polarization voltage determination unit 1522c outputs a determination result that the correction computation is performed. As a result, the correction computation of the internal resistance value is performed, and the SOH is increased as illustrated in FIG. 18(c). In a case where the energizing time is counted, and the count result of the continuous energizing time in the later period H1b of the discharging period H1 is equal to or more than the polarization determining threshold A2, the second polarization determination becomes that the correction computation is not possible. Therefore, the polarization voltage determination unit 1522c outputs a determination result that the correction computation is not possible. If the polarization voltage is deviated from the polarization determining threshold, the correction computation of the internal resistance value is suspended at a deviated timing, and the internal resistance value immediately before deviating from the polarization determining threshold is output. Therefore, the updating of the SOH is suspended during a period when the count result is deviated from the polarization determining threshold.

Thereafter, since a suspend period is short even though there is the suspend period, the polarization voltage (the polarization voltage indicated by symbol P5) before the current is switched remains a lot. Therefore, even when the count value of the continuous energizing time is less than the polarization determining threshold A2 in the charging period J1, it is determined by the first polarization determination that the internal resistance calculation is not possible. As a result, the updating of the SOH is suspended, and the SOH immediately before the polarization determination is output.

In the next discharging period H2, in a previous period H2a, the suspend period is long and the polarization voltage is relaxed within the polarization determining threshold. Therefore, the SOH is updated. However, in the later period H2b, the count value of the continuous energizing time becomes abnormal with respect to the polarization determining threshold A2. Therefore, the internal resistance computation becomes not possible, and the updating of the SOH is suspended. In the charging period J2, the polarization voltage before the charging current is input is deviated from the polarization determining threshold. Therefore, similarly to the case of the charging period J1, the SOH is not updated, and the SOH immediately before the polarization determination is output.

As described above, in this embodiment, the polarization voltage determination unit 1522c calculates the polarization voltage calculation value by Expression (10) on the basis of the voltage and the temperature of the battery and the current flowing to the battery, and the energizing time measurement unit 1524 calculates the continuous energizing time which is a time when the current flows to the battery. Then, as described above, the continuous energizing time is applied as an index of the polarization voltage during the energizing, and the polarization voltage calculation value is applied as the polarization voltage before the energizing starts, so that an index suitable to the use situation of the battery can be used as an index of the polarization voltage.

Then, the magnitude of the polarization voltage is determined on the basis of these indexes. In a case where the index is equal to or more than the polarization determining threshold, the battery is controlled on the basis of the internal resistance value calculated before the polarization voltage becomes equal to or more than the threshold. Therefore, it becomes possible to suppress a reduction of the internal resistance of the battery and the computation accuracy of the state of health (SOH) of the internal resistance.

Specifically, comparing the case of FIG. 18 with the case of FIG. 21, in the case of FIG. 21, the polarization voltage before the energizing starts in the charging periods J1 and J2 is deviated from the polarization determining threshold. In the charging periods J1 and J2, the updating of the SOH is not performed. On the other hand, in the case of FIG. 18, the polarization voltage immediately before the energizing starts is not considered. Therefore, even if the polarization voltage is in the situation of FIG. 21 (b), the updating (correcting of the internal resistance value) of the SOH is performed in the energization times (J1a, J2a).

Further, as an index of the polarization voltage, a value obtained by time-sequentially averaging the current flowing to the battery may be employed besides the two types described above. Then, at least two of these three types of indexes may be used according to a use situation of the battery. In addition, the indexes of the polarization voltage are not limited to the three types as long as the magnitude of the polarization voltage can be determined.

Fifth Embodiment

A fifth embodiment of the invention will be described with reference to FIGS. 22 and 23. Further, the configuration of the electric motor system of the hybrid electric vehicle in this embodiment is similar to that illustrated in FIG. 1 of the first embodiment. In the following, the description will be given focusing on different portions from the configuration of the first to fourth embodiments.

In the first to fourth embodiments, while the SOC and the SOCv are used to detect the computation error of the internal resistance, an accumulation value of the current is included in the SOCi in the SOC as shown in Expressions (1), and (8). Therefore, in a case where an error is included in the current sensor, the current error is accumulated, and thus there is a possibility that the SOC error is expanded. Accordingly, there is a concern that the computation accuracy of the internal resistance is reduced.

Therefore, in this embodiment, in order to mostly reduce an influence of the current accumulation error, the computation error of the internal resistance is detected by comparing a voltage measurement value and the battery voltage calculated using the equivalent circuit model illustrated in FIG. 7 instead of detecting the computation error of the internal resistance using the SOC and the SOCv, and the internal resistance value is corrected.

Figure 22:
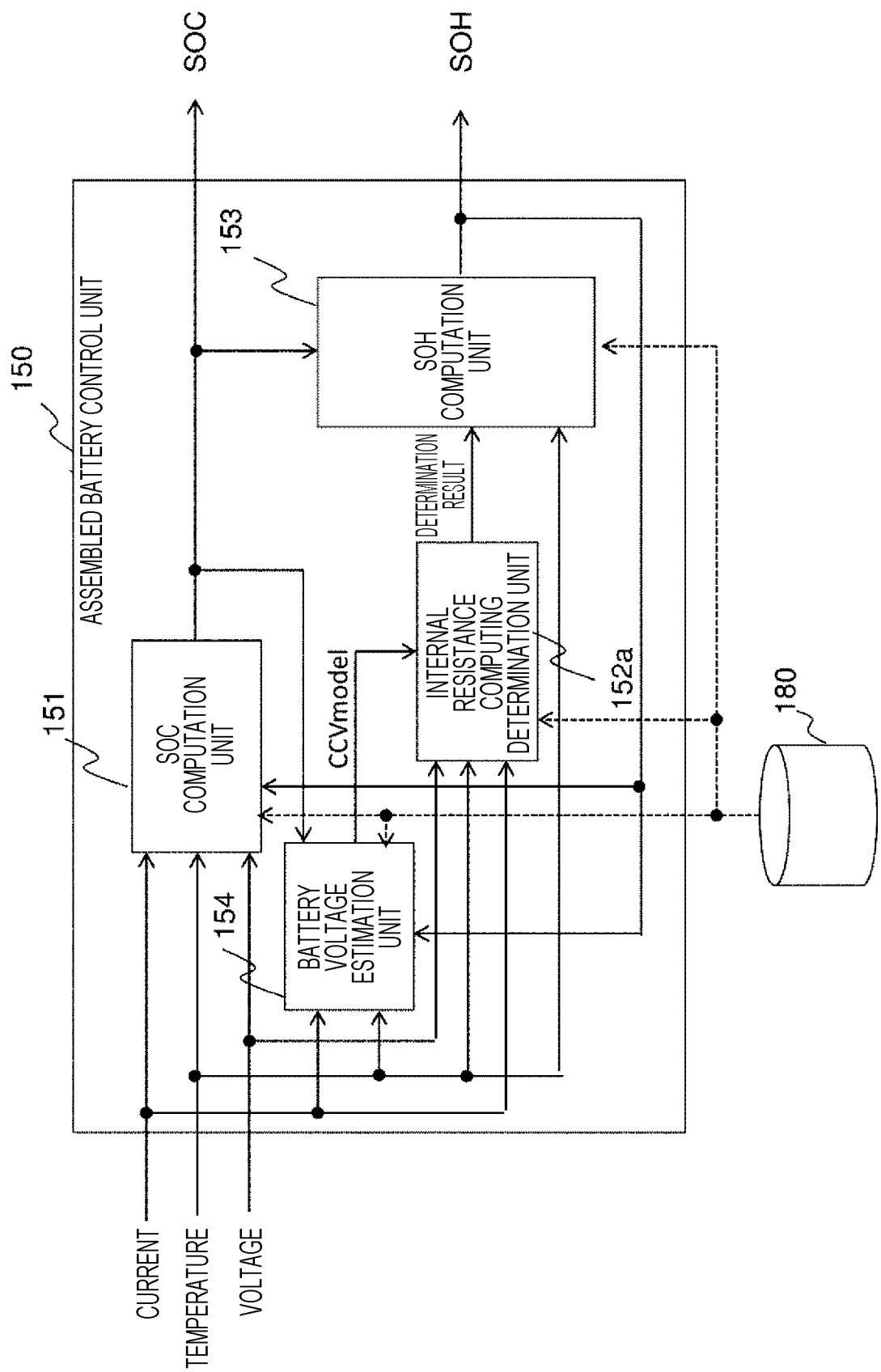
FIG. 22 is a block diagram illustrating a configuration of an assembled battery control unit in a fifth embodiment.

FIG. 22 is a block diagram illustrating a configuration of the assembled battery control unit 150 in this embodiment. A difference from FIG. 4 of the first embodiment is that a battery voltage estimation unit 154 is provided. The battery voltage estimation unit 154 calculates a battery voltage estimation value (CCVmodel) on the basis of the input current, temperature, SOC, and SOH as in the following Expression (14). Further, in Expression (14), the OCV is calculated from a correspondence relation between the SOC and the OCV illustrated in FIG. 6, and Vo and Vp are calculated from Expressions (2) and (3).

$$CCVmodel=OCV+Vo+Vp \quad (14)$$

Figure 23:
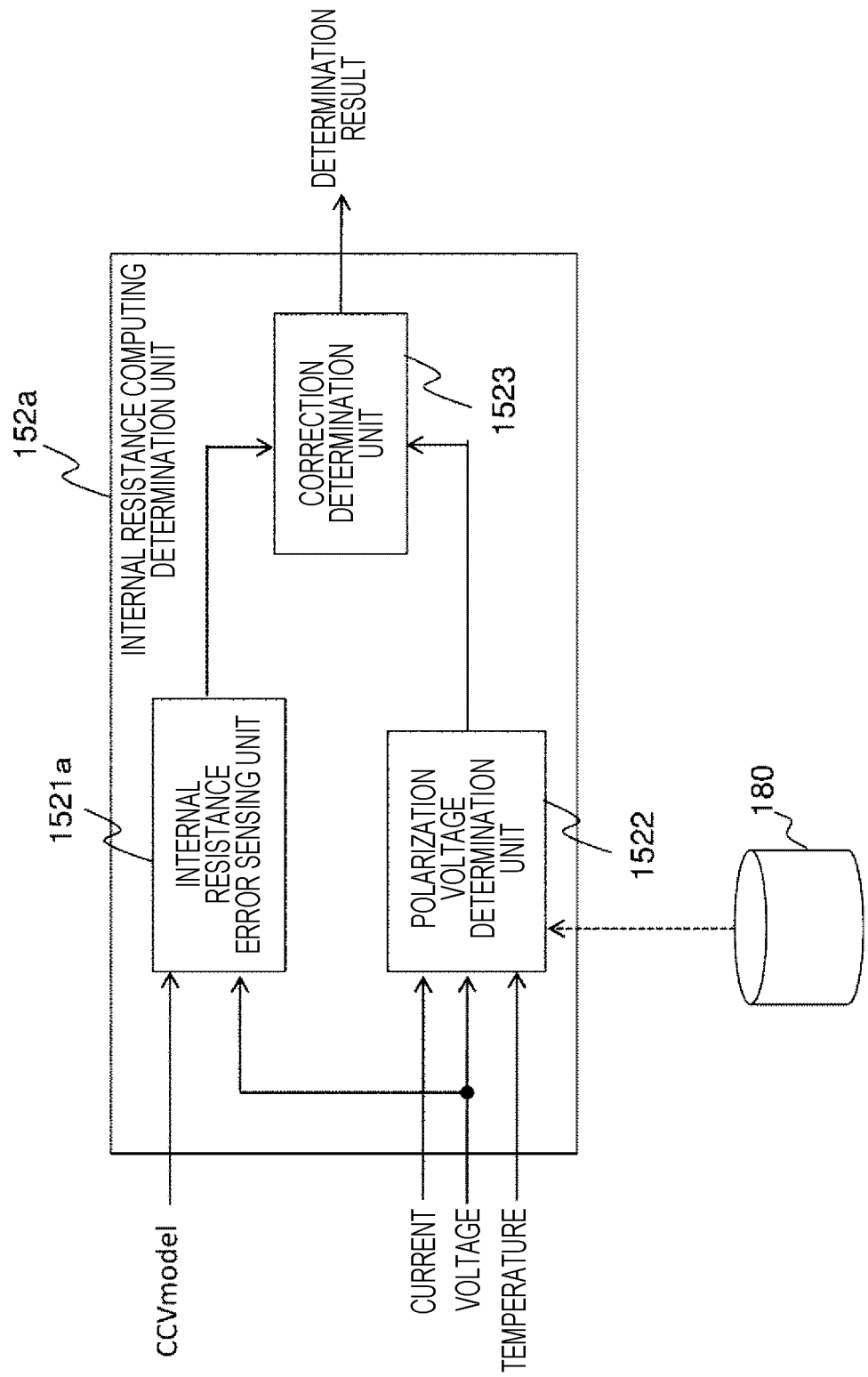
FIG. 23 is a block diagram illustrating a configuration of the internal resistance computing determination unit in the fifth embodiment.

FIG. 23 is a block diagram illustrating a configuration of an internal resistance computing determination unit 152a of the assembled battery control unit 150 illustrated in FIG. 22. An internal resistance error sensing unit 1521a receives the measured voltage, and the battery voltage estimation value CCVmodel calculated by the battery voltage estimation unit 154. The internal resistance error sensing unit 1521a calculates a difference between the battery voltage estimation value CCVmodel and the CCV (voltage measurement value), and outputs the calculated result to the correction determination unit 1523 as an input. The polarization voltage determination unit 1522 outputs the determination of the polarization voltage in any one of the first to fourth embodiments. The correction determination unit 1523 outputs a determination result on whether the computation of the internal resistance is possible on the basis of the difference input from the internal resistance error sensing unit 1521a and the determination on the polarization voltage input from the polarization voltage determination unit 1522.

If a difference (CCVmodel—CCV) of the correction computation of the internal resistance value based on the battery voltage estimation value CCVmodel and the CCV (voltage measurement value) is positive during the charging, the internal resistance value is corrected to be small. If the difference is negative, the internal resistance value is corrected to be large. On the other hand, if the different of those values are positive in the case of the discharging, the internal resistance value is corrected to be large. If the difference is negative, the internal resistance value is corrected to be small.

As described above, even when the battery voltage CCV is used instead of the SOC, the similar effect to that of the first embodiment can be achieved. In other words, in a case where the polarization voltage becomes large and exceeds a predetermined threshold, the correction computation of the internal resistance is suspended, and the internal resistance value is controlled to be an internal resistance computation value before (immediately before) being equal to or more than the threshold. Therefore, it is possible to suppress a reduction of computation accuracy of the internal resistance of the battery and the state of health (SOH) of the internal resistance.

In addition, in this embodiment, an error sensing method using a voltage has been described instead of using the SOC, but the invention is not limited thereto. Other than the SOC and the voltage, the resistance value may be directly detected. For example, a measured value R1 of the internal resistance value is calculated by the following Expression (15) on the basis of the current, the voltage, and the SOC.

$$R1=(CCV-OCV)/I \quad (15)$$

On the other hand, an initial value R0 of the internal resistance of the battery is calculated by the following Expression (16) on the basis of the equivalent circuit of FIG. 7.

$$R0=(Vo0+Vp0)/I \quad (16)$$

wherein, Vo0=I×RoInit and Vp0=Ip×RpInit.

Further, the SOH can be calculated by calculating a ratio of R1 and R0 as the following Expression (17).

$$SOH=100\times R1/R0$$

In this way, even in a case where the internal resistance is directly calculated besides the SOC and the voltage, it is possible to achieve the effect of suppressing a reduction of computation accuracy according to the determination on the polarization voltage similarly to the case of the SOC and the voltage.

Sixth Embodiment

FIG. 24 is a diagram for describing the sixth embodiment of the invention. In the first to fifth embodiments, the polarization determining threshold using the polarization voltage determination unit 1522 is set a constant value. However, the magnitude and the computation accuracy of the polarization voltage vary according to a state of the battery. For example, as illustrated in FIG. 15, as the battery temperature is lowered, and as deterioration proceeds, the polarization voltage is increased.

Therefore, if the polarization determining threshold is set constant, the threshold is too strictly set depending on a condition, and there is a possibility that the correction computation of the internal resistance is almost not performed. On the contrary, if the threshold is smoothly set, there is a possibility that the correction computation of the internal resistance is performed on a condition where the correction computation should not be performed.

Therefore, in this embodiment, the polarization determining threshold is varied according to a state of the battery. In this embodiment, the description will be given about the temperature and the SOH which are considered as being largely influenced among the parameters for determining the behavior of the polarization voltage.

FIG. 24 is a diagram illustrating an example of the data table of the polarization determining threshold according to the temperature and the SOH. In FIG. 24, the horizontal direction represents the SOH (%), and the vertical direction represents the temperature (° C.). The polarization determining threshold is set to be large as the SOH is increased, and set to be large as the temperature is lowered. In this way, it is possible to determine the polarization voltage with accuracy by using the data table of the threshold corresponding to the temperature and the SOH even on a condition the temperature and the SOH differ. In addition, in FIG. 24, the data table corresponds to the temperature and the SOC, but the invention is not limited thereto. The data table may be configured to correspond to the current and the SOC.

According to this embodiment, it is possible to suppress a reduction of frequency of the correction computation of the internal resistance, or a reduction of computation accuracy of the internal resistance which may occur in the first to fifth embodiments where the polarization determining threshold is kept constant. As a result, the control in a case where the threshold is exceeded, that is, the control to set the internal resistance to a value computed before being equal to or more than the threshold without performing the correction computation of the internal resistance can be accurately performed by accurately varying the threshold according to the battery state with accuracy. Further, it is possible to suppress a reduction of computation accuracy of the internal resistance of the battery and the state of the health (SOH) of the internal resistance.

Further, the description in this embodiment has been given about an example in a case where the data table of the threshold corresponding to the temperature and the SOH is used with respect to the polarization voltage directly calculated by Expressions (3) and (10) described in the first embodiment and the fourth embodiment. However, the threshold for the moving average current described in the second embodiment and the threshold for the continuous energizing time described in the third embodiment are also similarly stored as the data table corresponding to the temperature and the SOH, so that the polarization voltage can be determined with accuracy even on a condition where the temperature and the SOH differ.

While various embodiments and modifications have been described above, the invention is not limited to these contents. Other aspects which may be considered as falling within technical ideas of the invention shall be included in the scope of the invention.

REFERENCE SIGNS LIST 100 battery system
110 assembled battery
111 unit cell
112, 112a, 112b unit cell group
120 unit cell management unit
121, 121a, 121b unit cell control unit
122 voltage detecting circuit
123 control circuit
124 signal input/output circuit
125 temperature sensing unit
130 current sensing unit
140 voltage sensing unit
150 assembled battery control unit
151 SOC computation unit
152, 152a internal resistance computing determination unit
153 SOH computation unit
154 battery voltage estimation unit
160 signal communication unit
170 insulation element
180 memory unit
1511 SOCi calculation unit
1512 SOCv calculation unit
1513 combination computation unit
1521, 1521a internal resistance error sensing unit
1522, 1522a, 1522b, 1552c polarization voltage determination unit
1523 correction determination unit
1524 energizing time measurement unit
1531 internal resistance correction unit
1532 SOH calculation unit

The invention claimed is:

1. A battery control device which includes an internal resistance computation unit configured to calculate an internal resistance value of a battery, and controls charging and discharging of the battery on the basis of the internal resistance value calculated by the internal resistance computation unit, comprising:
an index computation unit which calculates an index indicating a polarization voltage of the battery; and
a determination unit which determines whether the index is equal to or more than a determination threshold,
wherein, when the determination unit determines that the index is equal to or more than the determination threshold, the charging and discharging of the battery are controlled on the basis of a previously determined internal resistance value calculated when the index was less than the determination threshold.

2. The battery control device according to claim 1, wherein the index computation unit calculates a polarization voltage calculation value as the index on the basis of at least one of a voltage and a temperature of the battery, and a current flowing to the battery.

3. The battery control device according to claim 1, wherein the index computation unit calculates a value obtained by time-sequentially averaging a current flowing to the battery as the index.

4. The battery control device according to claim 1, wherein the index computation unit calculates an energizing time of the battery as the index.

5. The battery control device according to claim 1, wherein the index computation unit calculates at least two of a first index which is a polarization voltage calculation value calculated on the basis of a voltage and a temperature of the battery, and a current flowing to the battery, a second index which is a value obtained by time-sequentially averaging the current flowing to the battery, and a third index which is an energizing time of the battery, and
the determination unit determines whether each index calculated by the index computation unit is equal to or more than each determination threshold which is set for each index.

6. The battery control device according to claim 2, wherein, when the determination unit determines that the index is equal to or more than the determination threshold in a non-energizing time before the battery starts to be energized, the battery after the energizing starts is controlled on the basis of the internal resistance value calculated when the index is less than the determination threshold before the determination.

7. The battery control device according to claim 1, wherein the internal resistance computation unit calculates the internal resistance value on the basis of a difference between two charging states of different calculation methods.

8. The battery control device according to claim 7, wherein one of the two charging states is a charging state in which the internal resistance value is calculated on the basis of an open circuit voltage of the battery.

9. The battery control device according to claim 1, wherein the internal resistance computation unit calculates the internal resistance value on the basis of a difference between a closed circuit voltage measurement value of the battery and a closed circuit voltage calculation value calculated on the basis of a current flowing to the battery.

10. The battery control device according to claim 1, wherein the determination threshold is set according to a temperature of the battery and/or a deterioration of the battery.

* * * * *